United States Patent
Ochi et al.

(10) Patent No.: US 9,365,923 B2
(45) Date of Patent: Jun. 14, 2016

(54) VAPOR DEPOSITION DEVICE AND VAPOR DEPOSITION METHOD

(71) Applicant: SHARP KABUSHIKI KAISHA, Osaka (JP)

(72) Inventors: Takashi Ochi, Osaka (JP); Shinichi Kawato, Osaka (JP); Yuhki Kobayashi, Osaka (JP); Manabu Niboshi, Osaka (JP); Satoshi Inoue, Osaka (JP); Yuto Tsukamoto, Osaka (JP); Katsuhiro Kikuchi, Osaka (JP); Masahiro Ichihara, Mitsuke (JP); Eiichi Matsumoto, Mitsuke (JP)

(73) Assignee: SHARP KABUSHIKI KAISHA, Osaka-Shi (JP)

( * ) Notice: Subject to any disclaimer, the term of this patent is extended or adjusted under 35 U.S.C. 154(b) by 0 days.

(21) Appl. No.: 14/765,557

(22) PCT Filed: Jan. 28, 2014

(86) PCT No.: PCT/JP2014/051784
§ 371 (c)(1),
(2) Date: Aug. 3, 2015

(87) PCT Pub. No.: WO2014/119548
PCT Pub. Date: Aug. 7, 2014

(65) Prior Publication Data
US 2015/0361546 A1 Dec. 17, 2015

(30) Foreign Application Priority Data
Feb. 4, 2013 (JP) ................................ 2013-019909

(51) Int. Cl.
*H01L 21/027* (2006.01)
*C23C 16/04* (2006.01)
(Continued)

(52) U.S. Cl.
CPC ............... *C23C 16/042* (2013.01); *C23C 14/04* (2013.01); *C23C 14/12* (2013.01); *H01L 51/001* (2013.01); *H01L 51/50* (2013.01)

(58) Field of Classification Search
CPC ..................................................... H01L 21/027
See application file for complete search history.

(56) References Cited

U.S. PATENT DOCUMENTS

2007/0017895 A1* 1/2007 Yotsuya .................... G03F 1/14
216/41

(Continued)

FOREIGN PATENT DOCUMENTS

| JP | 2007-23358 | 2/2007 |
|---|---|---|
| JP | 2011-47035 | 3/2011 |

(Continued)

OTHER PUBLICATIONS

International Search Report mailed Apr. 22, 2014, directed to International Application No. PCT/JP2014/051784; 2 pages.

*Primary Examiner* — Robert Vetere
(74) *Attorney, Agent, or Firm* — Morrison & Foerster LLP

(57) ABSTRACT

The vapor deposition device includes a plurality of vapor deposition masks whose lengths in Y axis and X axis directions are shorter than those of a film formation target substrate. Vapor deposition masks adjacent to each other in the Y axis direction is positionally displaced in the X axis direction. In an overlapping area in which mask opening group areas adjacent to each other in the Y axis direction overlap with each other in the X axis direction, opening lengths in the Y axis direction become shorter toward the outer side of each of the mask opening group areas in the plan view.

15 Claims, 20 Drawing Sheets

(51) Int. Cl.
*H01L 51/00* (2006.01)
*C23C 14/04* (2006.01)
*C23C 14/12* (2006.01)
*H01L 51/50* (2006.01)

(56) References Cited

U.S. PATENT DOCUMENTS

2007/0246706 A1* 10/2007 Brody .................. C23C 14/042
257/42

| | | | | |
|---|---|---|---|---|
| 2011/0053300 A1* | 3/2011 | Ryu | ...................... | C23C 14/042 438/34 |
| 2013/0059063 A1 | 3/2013 | Kawato et al. | | |
| 2013/0337597 A1 | 12/2013 | Kawato et al. | | |

FOREIGN PATENT DOCUMENTS

| JP | 2012-72461 | 4/2012 |
|---|---|---|
| WO | WO-2011/145456 | 11/2011 |
| WO | WO-2012/124512 | 9/2012 |

* cited by examiner

VAPOR DEPOSITION DEVICE AND VAPOR DEPOSITION METHOD

CROSS-REFERENCE TO RELATED APPLICATIONS

This application is a national phase filing under 35 U.S.C. §371 of International Application No. PCT/JP2014/051784, filed on Jan. 28, 2014, and which claims priority to Japanese Patent Application No. 2013-019909, filed on Feb. 4, 2013, the contents of which prior applications are incorporated herein by reference.

FIELD OF THE INVENTION

The present invention relates to a vapor deposition device and a vapor deposition method for use in scanning vapor deposition.

BACKGROUND OF THE INVENTION

Recent years have witnessed practical use of a flat-panel display in various products and fields. This has led to a demand for a flat-panel display that is larger in size, achieves higher image quality, and consumes less power.

Under such circumstances, great attention has been drawn to an organic EL display device that (i) includes an organic electroluminescence (hereinafter abbreviated to "EL") element which uses EL of an organic material and that (ii) is an all-solid-state flat-panel display which is excellent in, for example, low-voltage driving, high-speed response, and self-emitting.

An active matrix organic EL display device includes, for example, (i) a substrate made up of members such as a glass substrate and TFTs (thin film transistors) provided to the glass substrate and (ii) thin film organic EL elements provided on the substrate and electrically connected to the TFTs.

A full-color organic EL display device typically includes organic EL elements of red (R), green (G), and blue (B) as sub-pixels aligned on a substrate. The full-color organic EL display device carries out an image display by, with use of TFTs, selectively causing the organic EL elements to each emit light at a desired luminance.

Thus, such an organic EL display device needs to be produced through at least a process that forms, for each organic EL element, a luminescent layer having predetermined pattern and made of an organic luminescent material which emits light of the above three colors.

Examples of known methods for forming such a luminescent layer having a predetermined pattern encompass a vacuum vapor deposition method, an inkjet method, and a laser transfer method. For example, the vapor deposition method is mainly used in a low-molecular organic EL display device (OLED) to pattern a luminescent layer.

The vacuum vapor deposition method uses a vapor deposition mask (also referred to as a shadow mask) provided with openings having a predetermined pattern. A thin film having a predetermined pattern is formed by vapor-depositing vapor deposition particles (vapor deposition materials, film formation materials) from a vapor deposition source on a vapor deposition target surface through the openings of the vapor deposition mask. In this case, the vapor deposition is carried out for each color of luminescent layers (This is referred to as "selective vapor deposition").

The vacuum vapor deposition method is roughly classified into two methods: (i) a method for forming a film by fixing or sequentially moving a film formation target substrate' and a vapor deposition mask so that the film formation target substrate and the vapor deposition mask are brought into close contact with each other; and (ii) a scanning vapor deposition method for forming a film while scanning a film formation target substrate and a vapor deposition mask which are provided so as to be spaced from each other.

The method (i) uses a vapor deposition mask similar in size to a film formation target substrate. However, use of the vapor deposition mask similar in size to the film formation target substrate makes the vapor deposition mask larger in size as the film formation target substrate is made larger in size. Thus, such an increase in size of the film formation target substrate accordingly easily causes a gap between the film formation target substrate and the vapor deposition mask by self-weight bending and extension of the vapor deposition mask. Therefore, according to a large-sized substrate, it is difficult to carry out patterning with high accuracy and positional displacement of vapor deposition and/or color mixture occur(s). This makes it difficult to form a high-definition vapor-deposition pattern.

Further, as the film formation target substrate increases in size, not only the vapor deposition mask but also a frame or the like that holds, for example, the vapor deposition mask is made enormously large in size and weight. Thus, the increase in size of the film formation target substrate makes it difficult to handle, for example, the vapor deposition mask and the frame. This may cause a problem with productivity and/or safety. Further, a vapor deposition device itself and the accompanying devices are also made larger in size and complicated. This makes device design difficult and increases installation cost.

Moreover, the large vapor deposition mask has problems concerning deflection, a weight, and a cost, and also a great problem that a mask production circumstance has not been ready in terms of, for example, processing a material of a vapor deposition mask, patterning, and bonding of a frame.

In view of the problems, great attention has recently been drawn to a scanning vapor deposition method for carrying out vapor deposition while carrying out scanning by use of a vapor deposition mask which is smaller than a film formation target substrate (see, for example, Patent Literatures 1 and 2).

According to such a scanning vapor deposition method, a band-shaped vapor deposition mask, for example, is used, and that vapor deposition mask is, for example, integrated with a vapor deposition source. Then, vapor deposition particles are deposited onto an entire surface of a film formation target substrate while at least one of (i) the film formation target substrate and (ii) the vapor deposition mask and the vapor deposition source is moved with respect to the other.

Thus, the scanning vapor deposition method, which makes it unnecessary to use the vapor deposition mask similar in size to the film formation target substrate, can reduce the size of the vapor deposition mask.

PATENT LITERATURE

Japanese Patent Application Publication Tokukai No. 2011-47035 (Publication date: Mar. 10, 2011)

Pamphlet of International Publication No. 2012/124512 (International publication date: Sep. 20, 2012)

Japanese Patent Application Publication Tokukai No. 2007-23358 (Publication date: Feb. 1, 2007)

SUMMARY OF THE INVENTION

According to the scanning vapor deposition method, it is possible to shorten a length of the vapor deposition mask in a scanning direction such as a substrate carrying direction.

However, as disclosed in Patent Literatures 1 and 2, a length of the vapor deposition mask in a direction perpendicular to the scanning direction is equivalent to or larger than that of the film formation target substrate.

That is, in a case where (i) a small vapor deposition mask is employed which has lengths shorter in the scanning direction and the direction perpendicular to the scanning direction than respective lengths of a film formation target substrate 200 and (ii) a vapor-deposited film is formed while the small vapor deposition mask is moved in the scanning direction and the direction perpendicular to the scanning direction, a longer time is required for forming the vapor-deposited film and it is difficult to control a film thickness of the vapor-deposited film to be uniform in the direction perpendicular to the scanning direction.

In view of this, the length of the vapor deposition mask in the direction perpendicular to the scanning direction is set to be equivalent to or larger than that of the film formation target substrate.

Note that, as a method for reducing a size of a vapor deposition mask, Patent Literature 3 discloses a technique to form a large vapor deposition mask by connecting a plurality of small vapor deposition masks called "mask chip".

However, the technique of Patent Literature 3 is the method for forming a vapor deposition mask that corresponds to a large film formation target substrate, and the technique of Patent Literature 3 is not directed to scanning vapor deposition.

Moreover, according to Patent Literature 3, a notch section is provided on at least one of lateral surfaces which (i) are of respective adjacent mask chips and (ii) face each other. A gap section which is made up of the notch section and includes an opening corresponding to a pattern to be formed is provided in a boundary section between the adjacent mask chips, and thus the mask chips adjacent to each other in an X axis direction are connected in the X axis direction inside an opening (i.e., inside a sub-pixel) that corresponds to the pattern of the vapor-deposited film to be formed. From this, Patent Literature 3 has a problem that it is difficult to control the pattern by the gap section in the connection section.

Moreover, in a case where scanning vapor deposition is carried out by thus using the plurality of small vapor deposition masks, a uniform vapor-deposited film cannot be formed in a boundary section of the vapor deposition masks, and block separation occurs in which the vapor-deposited film is separated into blocks.

The present invention is accomplished in view of the problems, and its object is to provide a vapor deposition device and a vapor deposition method each of which can reduce a size of a vapor deposition mask as compared with a conventional one and can form a uniform vapor-deposited film without block separation.

In order to attain the object, a vapor deposition device in accordance with an aspect of the present invention is a vapor deposition device for forming vapor-deposited films on a film formation target substrate for use in a display device, the vapor-deposited films being formed for respective sub-pixels of the display device in a predetermined pattern, the vapor deposition device including: a vapor deposition unit having a vapor deposition source and a plurality of vapor deposition masks; and a moving device for moving one of the vapor deposition unit and the film formation target substrate relatively to the other, a length of each of the plurality of vapor deposition masks in a first direction being shorter than a length of a vapor deposition area of the film formation target substrate in the first direction, and a length of each of the plurality of vapor deposition masks in a second direction being shorter than a length of the vapor deposition area in the second direction, the first direction being a moving direction by the moving device, and the second direction being perpendicular to the first direction, the plurality of vapor deposition masks including two or more vapor deposition masks arranged at least in the first direction, each of the plurality of vapor deposition masks having one or more mask opening group areas which are arranged in the second direction via a shielding area corresponding to at least one pixel, each of the one or more mask opening group areas (i) including a plurality of mask openings which are arranged at least in the second direction and (ii) pairing up with an injection hole of the vapor deposition source, vapor deposition particles being injected from the injection hole, the two or more vapor deposition masks adjacent to each other in the first direction being out of alignment in the second direction such that, (i) when viewed along the first direction, mask openings in a first end part of each of the one or more mask opening group areas of one of the two or more vapor deposition masks overlap, in the second direction, with mask openings in a second end part of each of the one or more mask opening group areas of another one of the two or more vapor deposition masks which is adjacent to the one of the two or more vapor deposition masks, the first end part and the second end part being respective two end parts of each of the one or more mask opening group areas in the second direction, and (ii) a vapor-deposited film formed via mask openings in the first end part and in the second end part which are adjacent to each other in the first direction extends on one straight line in the first direction, a total length in the second direction of ones of the plurality of vapor deposition masks being longer than the length of the vapor deposition area in the second direction, the mask openings being provided for the respective sub-pixels, in each of the first end part and the second end part which overlap with each other in the second direction when viewed along the first direction, the mask openings being formed to have, in the first direction, opening lengths which become shorter toward an outer side of each of the one or more mask opening group areas when viewed in a normal direction which is normal to a principal surface of each of the plurality of vapor deposition masks.

The vapor deposition method in accordance with an aspect of the present invention is a method for forming vapor-deposited films on a film formation target substrate for use in a display device, the vapor-deposited films being formed for respective sub-pixels of the display device in a predetermined pattern, the method including the steps of: moving one of a vapor deposition unit and the film formation target substrate relatively to the other in a first direction; and using the vapor deposition unit having a vapor deposition source and a plurality of vapor deposition masks, (a) a length of each of the plurality of vapor deposition masks in the first direction being shorter than a length of a vapor deposition area of the film formation target substrate in the first direction, and a length of each of the plurality of vapor deposition masks in a second direction being shorter than a length of the vapor deposition area in the second direction, the second direction being perpendicular to the first direction, (b) the plurality of vapor deposition masks including two or more vapor deposition masks arranged at least in the first direction, (c) each of the plurality of vapor deposition masks having one or more mask opening group areas which are arranged in the second direction via a shielding area corresponding to at least one pixel, (d) each of the one or more mask opening group areas (i) including a plurality of mask openings which are arranged at least in the second direction and (ii) pairing up with an injection hole of the vapor deposition source, vapor deposition particles being injected from the injection hole, (e) the two or more vapor deposition masks adjacent to each other in the first direction being out of alignment in the second direction such that, (i) when viewed along the first direction, mask openings in a first end part of each of the one or more mask opening group areas of one of the two or more vapor deposition masks overlap, in the second direction, with mask openings in a second end part of each of the one or more mask opening group areas of another one of the two or more vapor deposition masks which is adjacent to the one of the two or more vapor deposition masks, the first end part and the second end part being respective two end parts of each of the one or more mask opening group areas in the second direction, and (ii) a vapor-deposited film formed via mask openings in the first end part and in the second end part which are adjacent to each other in the first direction extends on one straight line in the first direction, (f) a total length in the second direction of ones of the plurality of vapor deposition masks 80 being longer than the length of the vapor deposition area in the second direction, (g) in each of the first end part and the second end part which overlap with each other in the second direction when viewed along the first direction, the mask openings being formed to have, in the first direction, opening lengths which become shorter toward an outer side of each of the one or more mask opening group areas when viewed in a normal direction which is normal to a principal surface of each of the plurality of vapor deposition masks.

Note that each of the opening lengths "in the first direction . . . when viewed in a normal direction which is normal to a principal surface of each of the plurality of vapor deposition masks" is not a length of the mask opening itself of each of the plurality of vapor deposition masks but is a substantial length of an actual opening in the vapor deposition mask in the first direction when viewed in the normal direction (i.e., a length, in the first direction, of an opening area through which vapor deposition particles can pass). That is, in a case where a mask opening of a vapor deposition mask is partially closed by, for example, a shielding plate when viewed in the normal direction, "the opening length in the first direction when viewed in the normal direction" indicates a length of a mask opening, which is actually open, in the first direction when viewed in the normal direction (i.e., a length, in the first direction, of a mask opening that is not closed by the shielding plate).

According to an aspect of the present invention, it is possible to carry out scanning vapor deposition with the use of the vapor deposition mask that is smaller than a conventional one, by dividing a mask opening which corresponds to each of sub-pixels in the second direction of the film formation target substrate. This makes it possible to reduce a weight of the vapor deposition mask as compared with a conventional one, and it is possible to inhibit positional displacement in vapor deposition caused due to deflection of the vapor deposition mask. It is therefore possible to inhibit blurred vapor deposition which is caused due to deflection of the vapor deposition mask.

Moreover, according to an aspect of the present invention, the vapor deposition masks adjacent to each other in the first direction are arranged so as to be out of alignment in the second direction and, in each of the first end part and the second end part which overlap with each other in the second direction when viewed along the first direction, the mask openings are formed to have, in the first direction, opening lengths which become shorter toward an outer side of each of the one or more mask opening group areas when viewed in the normal direction. This makes it possible to gradually change opening lengths in a boundary section between mask opening group areas in vapor deposition masks adjacent to each other in the first direction. The boundary section is a mask relaying section at which any two of the plurality of vapor deposition masks are connected to each other.

From this, even in a case where scanning vapor deposition is carried out with the use of the vapor deposition mask that is smaller than a conventional one by dividing a mask opening which corresponds to each of sub-pixels in the second direction of the film formation target substrate as above described, it is possible to carry out uniform vapor deposition without block separation in the boundary section between the mask opening group areas.

Moreover, according to an aspect of the present invention, the vapor deposition masks are not connected in the X axis direction within a sub-pixel, and it is therefore easy to control patterning.

Moreover, according to an aspect of the present invention, each of the mask opening group areas pairs up with the injection hole of the vapor deposition source, and this makes it possible to determine a source (injection hole) from which the vapor deposition particles come to each of the mask openings. It is therefore possible to set a location of the mask opening which location is optimal to an incoming angle of the vapor deposition particles. This allows (i) prevention of blurred vapor deposition and (ii) improvement in vapor deposition efficiency.

In the boundary section between the mask opening group areas which are adjacent to each other in the second direction, vapor deposition particles which have come from two injection holes corresponding to the respective mask opening group areas tend to be mixed. However, as above described, the mask opening group areas which are adjacent to each other in the second direction are provided via the shielding area corresponding to at least one pixel, and this makes it possible to prevent blurred vapor deposition, in particular, blurred vapor deposition in the boundary section between the mask opening group areas which are adjacent to each other in the second direction.

DETAILED DESCRIPTION OF THE INVENTION

The following description will discuss embodiments of the present invention in detail.

The following description will discuss an embodiment of the present invention with reference to FIGS. 1 through 13.

In the present embodiment, a method for producing an organic EL display device which includes organic EL elements (i.e., light-emitting elements) provided for respective sub-pixels will be described as an example of the method for producing a display device with the use of a vapor deposition device in accordance with the present embodiment.

First, the following description will discuss a configuration of an organic EL display device which is of an RGB full-color display type and is of a bottom emission type in which light is extracted from a TFT substrate side, as an example of the organic EL display device that is produced by the vapor deposition device of the present embodiment.

Figure 8:
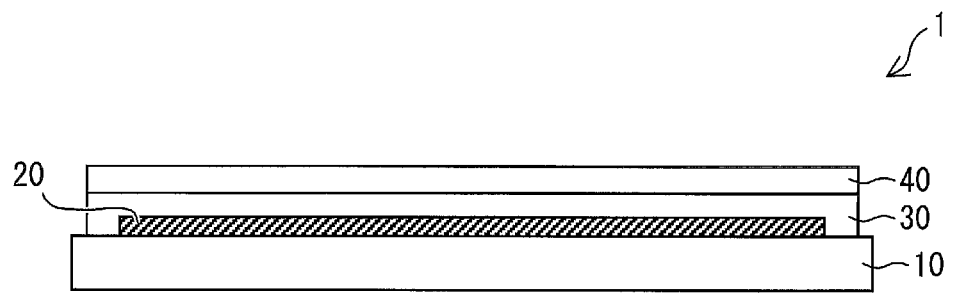
FIG. 8 is a cross-sectional view schematically illustrating a configuration of an organic EL display device which is of an RGB full-color display type, in accordance with Embodiment 1.
Figure 9:
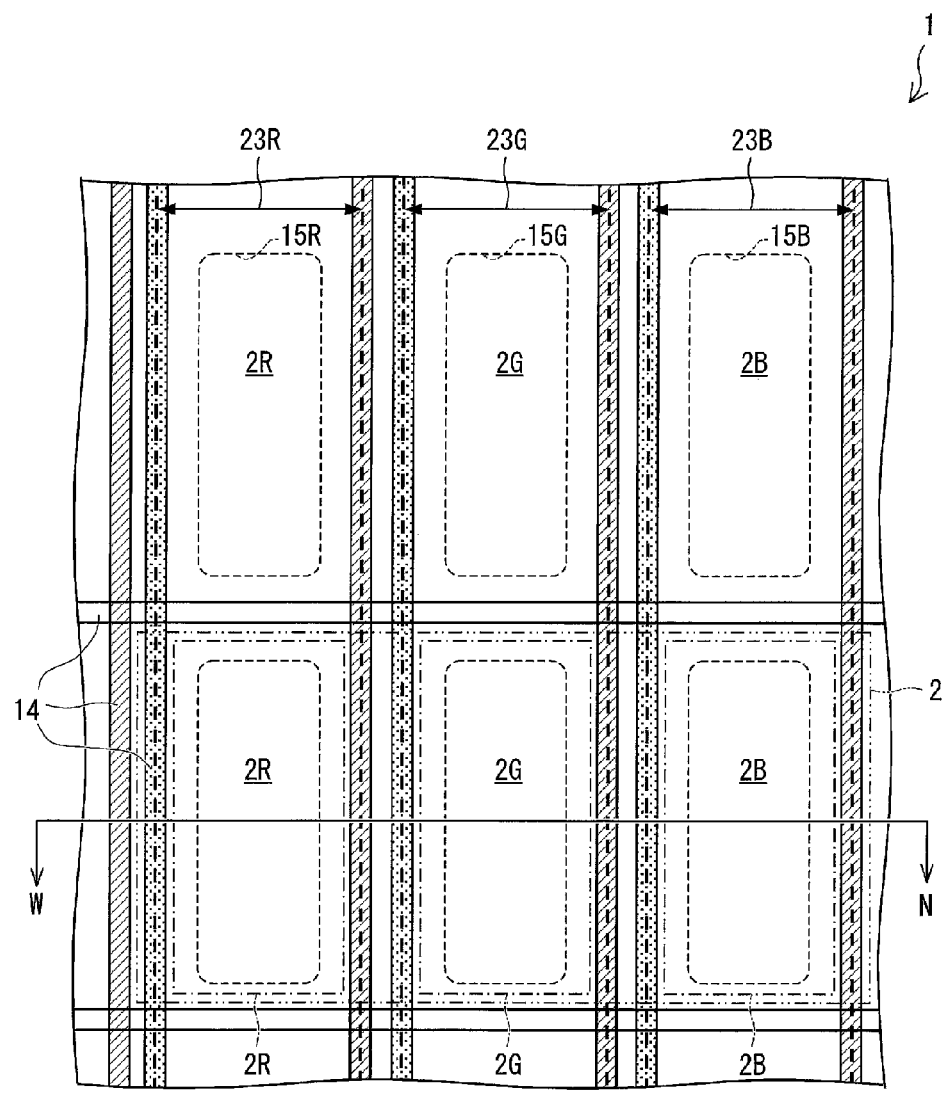
FIG. 9 is a plan view illustrating a configuration of sub-pixels constituting the organic EL display device illustrated in FIG. 8.
Figure 10:
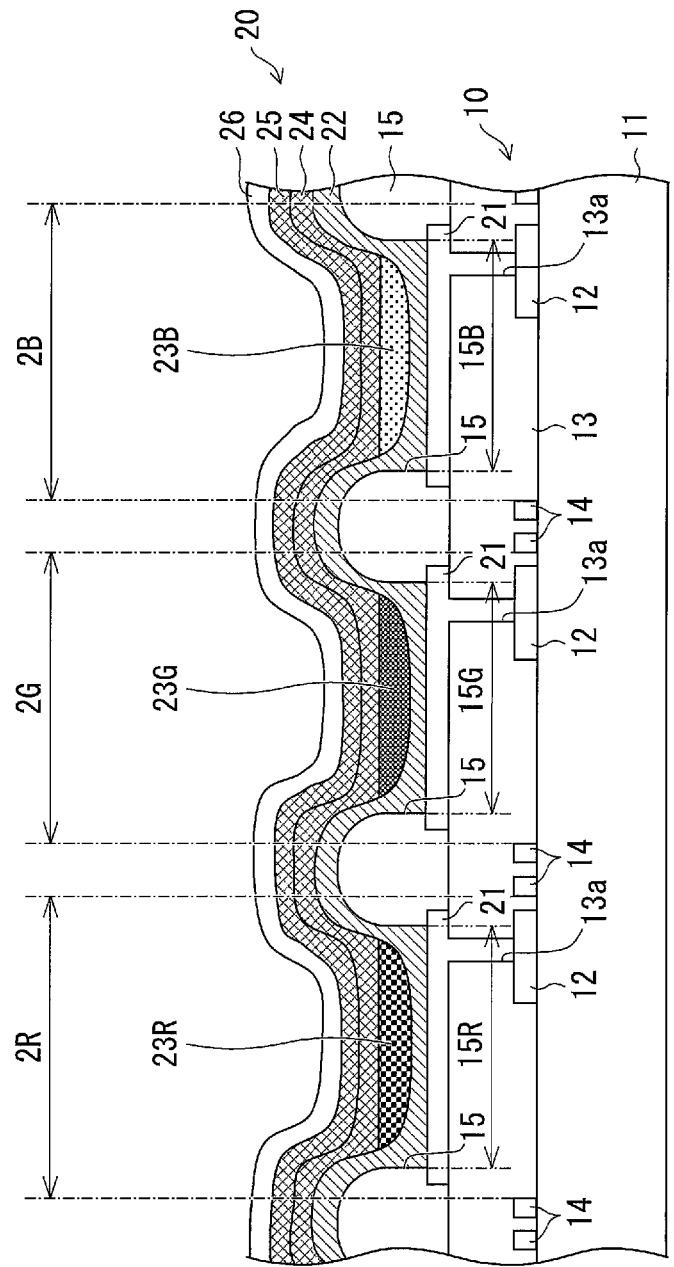
FIG. 10 is a cross-sectional view of a TFT substrate in the organic EL display device taken along the line W-W of FIG. 9.

FIG. 8 is a cross-sectional view schematically illustrating a configuration of an organic EL display device 1 which is of an RGB full-color display type. FIG. 9 is a plan view illustrating a configuration of sub-pixels 2R, 2G, and 2B constituting the organic EL display device 1 illustrated in FIG. 8. FIG. 10 is a cross-sectional view of a TFT substrate 10 in the organic EL display device 1 taken along the line W-W of FIG. 9.

As illustrated in FIG. 8, the organic EL display device 1 produced in the present embodiment has a configuration in which an organic EL element 20 (light-emitting element), an adhesive layer 30, and a sealing substrate 40 are stacked in this order on a TFT substrate 10 on which a TFT 12 (see FIG. 10) has been provided, and the organic EL element 20 and the TFT 12 are connected to each other.

The organic EL element 20 is sealed between two substrates (i.e., the TFT substrate 10 and the sealing substrate 40) by bonding the TFT substrate 10, on which the organic EL element 20 has been stacked, to the sealing substrate 40 with the use of the adhesive layer 30.

The TFT substrate 10 includes, for example, a transparent insulating substrate 11 such as a glass substrate, as a supporting substrate (see FIG. 10). As illustrated in FIG. 9, a plurality of wires 14 are provided on the insulating substrate 11. The plurality of wires 14 include (i) a plurality of gate lines which extend in a horizontal direction and (ii) a plurality of signal lines which extend in a vertical direction and intersect with the plurality of gate lines. The plurality of gate lines are connected with a gate line driving circuit (not illustrated) for driving the plurality of gate lines, and the plurality of signal lines are connected with a signal line driving circuit (not illustrated) for driving the plurality of signal lines.

The organic EL display device 1 is a full-color active matrix organic EL display device. On the insulating substrate 11, sub-pixels 2R, 2G, and 2B made up of respective organic EL elements 20 of red (R), green (G), and blue (B) are provided in a matrix manner, in respective regions surrounded by the plurality of wires 14. Each of the regions surrounded by the plurality of wires 14 corresponds to one (1) sub-pixel (dot), and the organic EL elements 20 are provided for respective of the sub-pixels. Thus, a luminescent region of R, G, or B is formed for each of the sub-pixels.

A pixel 2 (i.e., one (1) pixel) is configured by sub-pixels 2R, 2G, and 2B. The sub-pixel 2R is provided for causing red light to pass through, the sub-pixel 2G is provided for causing green light to pass through, and the sub-pixel 2B is provided for causing blue light to pass through.

For the sub-pixels 2R, 2G, and 2B, openings 15R, 15G, and 15B are respectively provided which are covered with luminescent layers 23R, 23G, and 23B which are of different colors and arranged in a stripe pattern, and thus serve as luminescent regions from which different colors of light are emitted in the respective sub-pixels 2R, 2G, and 2B. The luminescent layers 23R, 23G, and 23B are formed in a pattern by vapor deposition for each of the colors.

For each of the sub-pixels 2R, 2G, and 2B, a TFT 12 connected with a first electrode 21 of the organic EL element 20 is provided. Intensity of light emitted from each of the sub-pixels 2R, 2G, and 2B is determined by scanning and selection with the use of the wires 14 and the TFT 12. As such, in the organic EL display device 1, the organic EL element 20 is controlled to selectively emit light at a desired luminance with the use of the TFT 12, and thus an image is displayed.

As illustrated in FIG. 10, the TFT substrate 10 has a configuration in which TFTs 12 (switching element) and the plurality of wires 14, an interlayer film 13 (interlayer insulating film, planarizing film), and an edge cover 15 are provided in this order on a transparent insulating substrate 11 such as a glass substrate.

On the insulating substrate 11, the plurality of wires 14 are provided, and the TFTs 12 are provided for the respective sub-pixels 2R, 2G, and 2B. Note that a configuration of the TFT is conventionally well known. Therefore, layers in each of the TFTs 12 are not illustrated and not described here.

The interlayer film 13 is provided in an entire area of the insulating substrate 11 so as to cover the TFTs 12 and the plurality of wires 14 on the insulating substrate 11.

On the interlayer film 13, the first electrode 21 of the organic EL element 20 is provided.

The interlayer film 13 has a contact hole 13a through which the first electrode 21 of the organic EL element 20 is electrically connected with the TFT 12. Thus, the TFT 12 is electrically connected with the organic. EL element 20 via the contact hole 13a.

Moreover, on the interlayer film 13, the edge cover 15 is provided so as to cover a pattern end part of the first electrode 21 in order to prevent short-circuit between the first electrode 21 and the second electrode 26 in the organic EL element 20. The edge cover 15 has openings 15R, 15G, and 15B which are provided for the respective sub-pixels 2R, 2G, and 2B. The openings 15R, 15G, and 15B of the edge cover 15 serve as luminescent regions of the respective sub-pixels 2R, 2G, and 2B.

The organic EL element 20 is a light-emitting element which can emit light at a high luminance by low-voltage direct current driving. The organic EL element 20 is made up of the first electrode 21, an organic EL layer, and the second electrode 26 which are stacked in this order.

The first electrode 21 is a layer having a function to inject (supply) positive holes to the organic EL layer. As above described, the first electrode 21 is connected with the TFT 12 via the contact hole 13a.

The organic EL layer has a configuration in which, from a first electrode 21 side, for example, a hole injection layer/hole transfer layer 22, luminescent layers 23R, 23G, and 23B, an electron transfer layer 24, and an electron injection layer 25 are provided in this order between the first electrode 21 and the second electrode 26. Note that the stacking order is of a case where the first electrode 21 serves as an anode and the second electrode 26 serves as a cathode. In a case where the first electrode 21 serves as a cathode and the second electrode 26 serves as an anode, the stacking order in the organic EL layer is reversed.

Moreover, in the present embodiment, an example is illustrated in which the hole injection layer/hole transfer layer 22 in which a hole injection layer and a hole transfer layer are integrated is employed as a hole injection layer and a hole transfer layer. Note, however, that the present embodiment is not limited to this. The hole injection layer and the hole transfer layer can be provided as respective separate layers. Moreover, the organic EL display device 1 can include an electron transfer layer/electron injection layer instead of the electron transfer layer 24 and the electron injection layer 25.

Note that functions and materials of those layers constituting the organic EL layer are conventionally known as disclosed in Patent Literature 2 which was filed by the applicants of the present application. Therefore, descriptions of such layers are omitted.

Note that the configuration of the organic EL element 20 is not limited to the above described configuration, and it is possible to employ any of conventionally-known various layer configurations, in accordance with a requested characteristic of the organic EL element 20.

Figure 11:
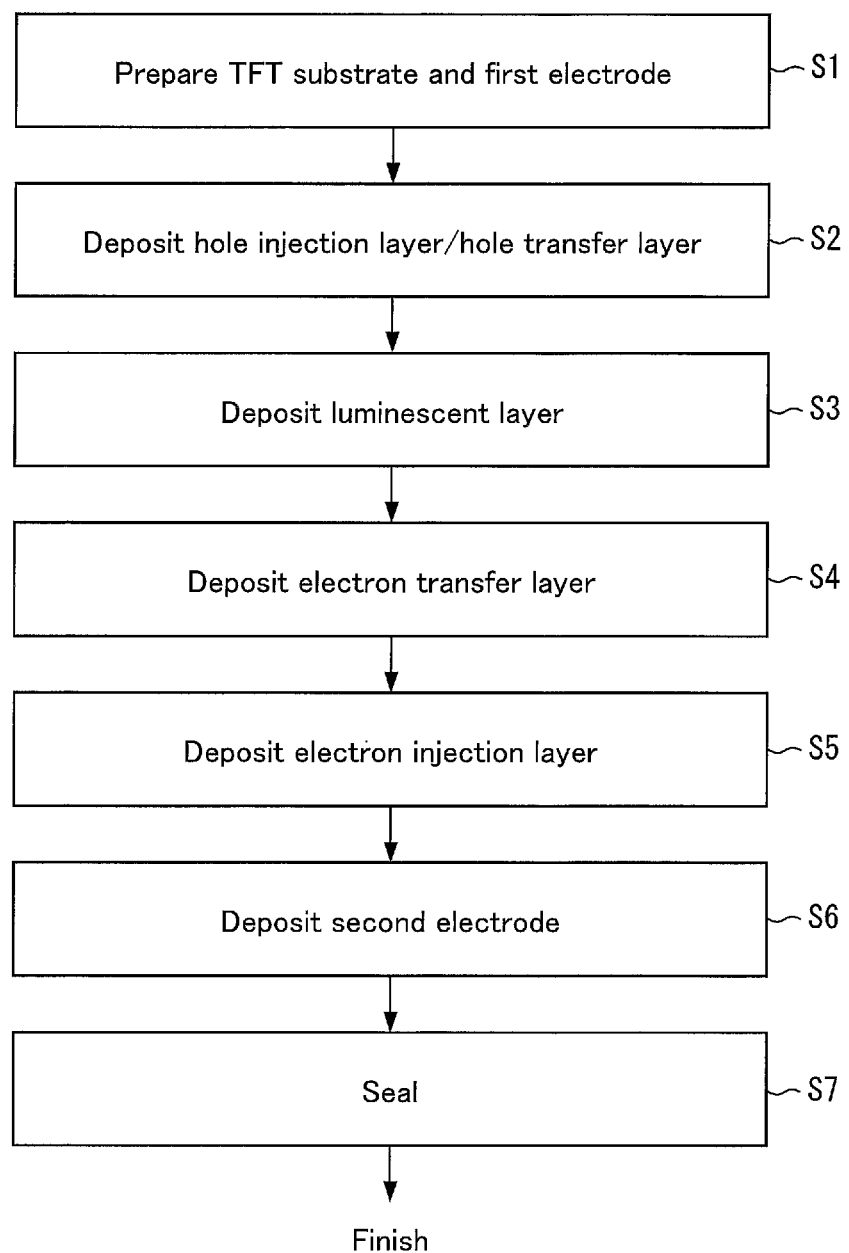
FIG. 11 is a flowchart illustrating an example of sequential processes for producing the organic EL display device in accordance with Embodiment 1.

FIG. 11 is a flowchart illustrating an example of sequential processes for manufacturing the organic EL display device 1.

As illustrated in FIG. 11, a method for manufacturing the organic EL display device 1 in accordance with the present embodiment includes, for example, a TFT substrate/first electrode preparing step (S1), a hole injection layer/hole transfer layer depositing configuration (S2), a luminescent layer depositing step (S3), an electron transfer layer depositing step (S4), an electron injection layer depositing step (S5), a second electrode depositing step (S6), and a sealing step (S7).

Note that the stacking order is of a case where the first electrode 21 serves as an anode and the second electrode 26 serves as a cathode. In a case where the first electrode 21 serves as a cathode and the second electrode 26 serves as an anode, the stacking order in the organic EL layer is reversed.

Moreover, the materials of the first electrode 21 and the second electrode 26 are also interchanged.

First, as illustrated in FIG. 10, photosensitive resin is applied, by a known technique, to the insulating substrate 11 on which the TFTs 12, the plurality of wires 14, and the like have been provided, and patterning is carried out by photolithography. Thus, the interlayer film 13 is formed on the insulating substrate 11.

Next, the contact hole 13a is formed in the interlayer film 13 so that the first electrode 21 is electrically connected to the TFT 12. Then, the first electrode 21 is formed on the interlayer film 13. The first electrode 21 can be, for example, (i) a conductive film (electrode film) that is made of a transparent electrode material such as ITO (indium tin oxide) or (ii) a transparent or semitransparent thin film made of a metal material such as gold (Au).

The first electrode 21 can be formed by (i) a known film formation method such as sputtering, CVD (chemical vapor deposition), or printing or (ii) a combination of a vacuum deposition method with the use of an open mask, in which an entire display area is opened, and a patterning method with the use of photolithography.

Next, the edge cover 15 is formed in a predetermined pattern. The edge cover 15 can be formed by using a method and a material similar to those of the interlayer film 13.

Through the above processes, the TFT substrate 10 and the first electrode 21 are prepared (S1).

Next, the TFT substrate 10 which has been prepared through the above processes is subjected to (i) low-pressure bake for dehydration and (ii) oxygen plasma treatment for washing a surface of the first electrode 21.

Next, by a vacuum vapor deposition method with the use of an open mask in which an entire display area is opened, a hole injection layer and a hole transfer layer (in the present embodiment, the hole injection layer/hole transfer layer 22) are deposited onto the TFT substrate 10 in the entire display area of the TFT substrate 10 (S2). Note that the vapor deposition onto the entire display area means vapor deposition that continuously spreads across adjacent sub-pixels of different colors.

Next, the luminescent layers 23R, 23G, and 23B corresponding to the respective sub-pixels 2R, 2G, and 2B are formed by selective application (pattern formation) on the hole injection layer/hole transfer layer 22 so as to cover the respective openings 15R, 15G, and 15B of the edge cover 15 (S3).

The selective vapor deposition is carried out by the vacuum vapor deposition method in which the vapor deposition device of the present embodiment is used. The vapor deposition method carried out with the use of the vapor deposition device of the present embodiment can be particularly suitably employed for such selective application (pattern formation) of the luminescent layers 23R, 23G, and 23B.

Next, by a method similar to that of the hole injection layer/hole transfer layer depositing step (S2), the electron transfer layer 24 is deposited in the entire display area of the TFT substrate 10 so as to cover the hole injection, layer/hole transfer layer 22 and the luminescent layers 23R, 23G, and 23B (S4).

Then, by a method similar to that of the hole injection layer/hole transfer layer depositing step (S2), the electron injection layer 25 is deposited in the entire display area of the TFT substrate 10 so as to cover the electron transfer layer 24 (S5).

Next, by a method similar to that of the hole injection layer/hole transfer layer depositing step (S2), the second electrode 26 is deposited in the entire display area of the TFT substrate 10 so as to cover the electron injection layer 25 (S6).

As a material (electrode material) of the second electrode 26, a metal such as a magnesium alloy (MgAg) is suitably used which has a small work function. Through the processes, the organic EL element 20 including the organic EL layer, the first electrode 21, and the second electrode 26 is formed on the TFT substrate 10.

Note that the materials of the respective layers in the organic EL element 20 can be similar to conventional ones, and a thickness and a size of each of the layers can also be set in a manner similar to a conventional one. For example, the layers can be made of materials which are similar to those disclosed in Patent Literature 2 and can have sizes which are similar to those disclosed in Patent Literature 2.

Next, as illustrated in FIG. 8, the TFT substrate 10 on which the organic EL element 20 has been provided and the sealing substrate 40 are bonded together with the adhesive layer 30 so as to seal the organic EL element 20. The sealing substrate 40 is made up of an insulating substrate such as a glass substrate or a plastic substrate. Through the above processes, the organic EL display device 1 is prepared.

As above described, the organic EL display device 1 is manufactured by the use of scanning vapor deposition in which the vapor deposition device of the present embodiment is used to form the layers (films) corresponding to the sub-pixels 2R, 2G, and 2B, e.g., to deposit the organic films (such as the luminescent layers 23R, 23G, and 23B) made of an organic material.

In the present embodiment, at least one the film formation target substrate and the vapor deposition unit included in the vapor deposition device of the present embodiment is moved relatively to the other while a constant gap is provided between the vapor deposition unit and the film formation target substrate. Thus, a vapor-deposited film is formed with the use of a vapor deposition mask that has an opening area (mask opening group formation area) which is smaller than a vapor deposition area of the film formation target substrate.

The following description will discuss a method for forming a pattern of a vapor-deposited film 221 with the use of the vapor deposition device of the present embodiment as a device for manufacturing the organic EL display device 1.

Note that, in a case where selective application of the luminescent layers 23R, 23G, and 23B onto the TFT substrate 10 is carried out as the pattern formation of the vapor-deposited film 221 onto the film formation target substrate 200, mask openings 81 of the vapor deposition mask 80 are formed in accordance with a size of and a pitch between same-color rows of the luminescent layers 23R, 23G, and 23B. Moreover, in a case where the vapor deposition material is a material of the luminescent layers 23R, 23G, and 23B in the organic EL display device 1, vapor deposition of the luminescent layers 23R, 23G, and 23B in the organic EL deposition process is carried out for each color of the luminescent layers 23R, 23G, and 23B.

Figure 1:
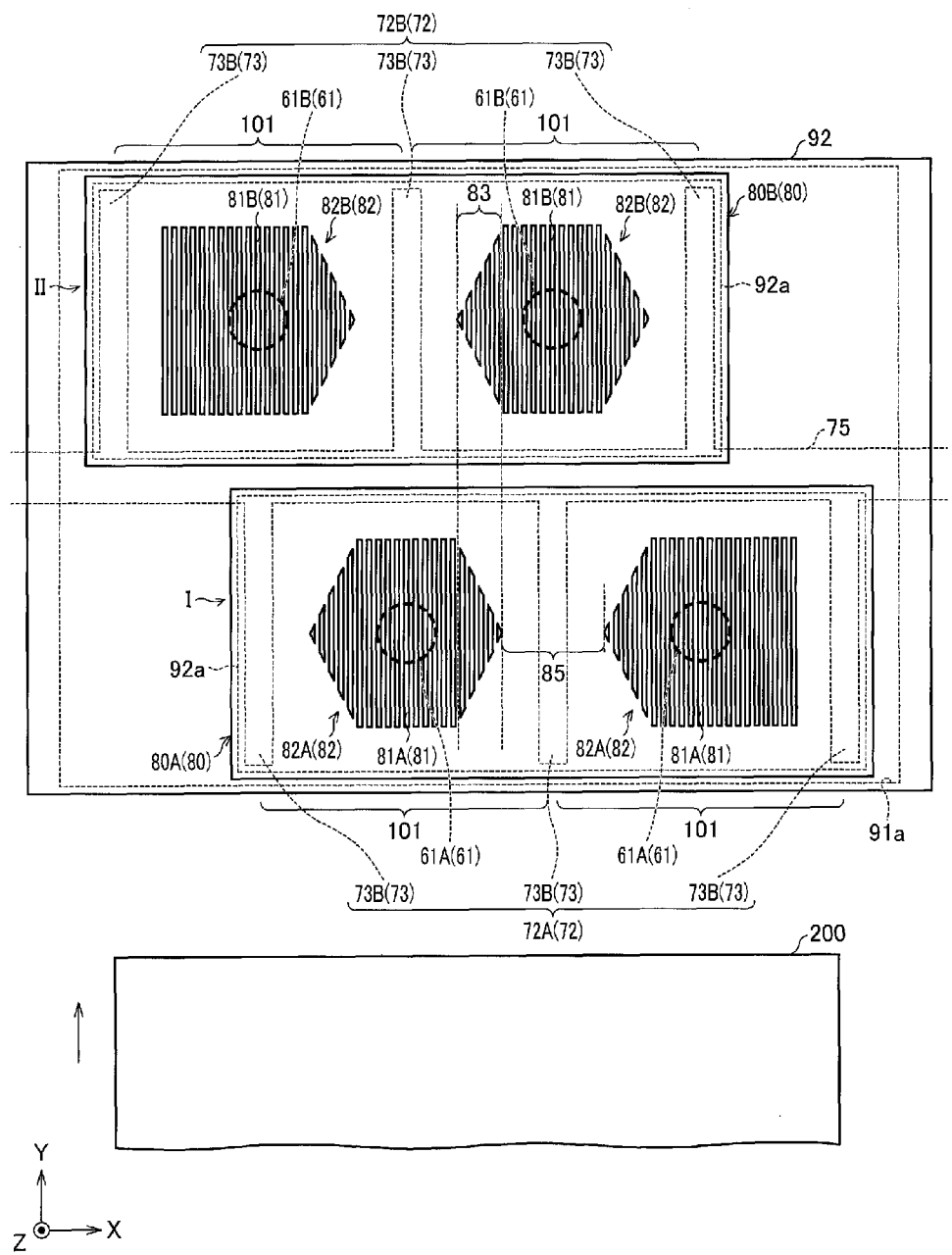
FIG. 1 is a plan view illustrating a film formation target substrate 200 and a configuration of main parts of a vapor deposition unit included in a vapor deposition device that is used as a device for producing an organic EL device, in accordance with Embodiment 1.

FIG. 1 is a plan view illustrating a film formation target substrate 200 and a configuration of main parts of a vapor deposition unit 54 included in a vapor deposition device 50 that is used as a device for producing an organic EL device, in accordance with the present embodiment.

Figure 2:
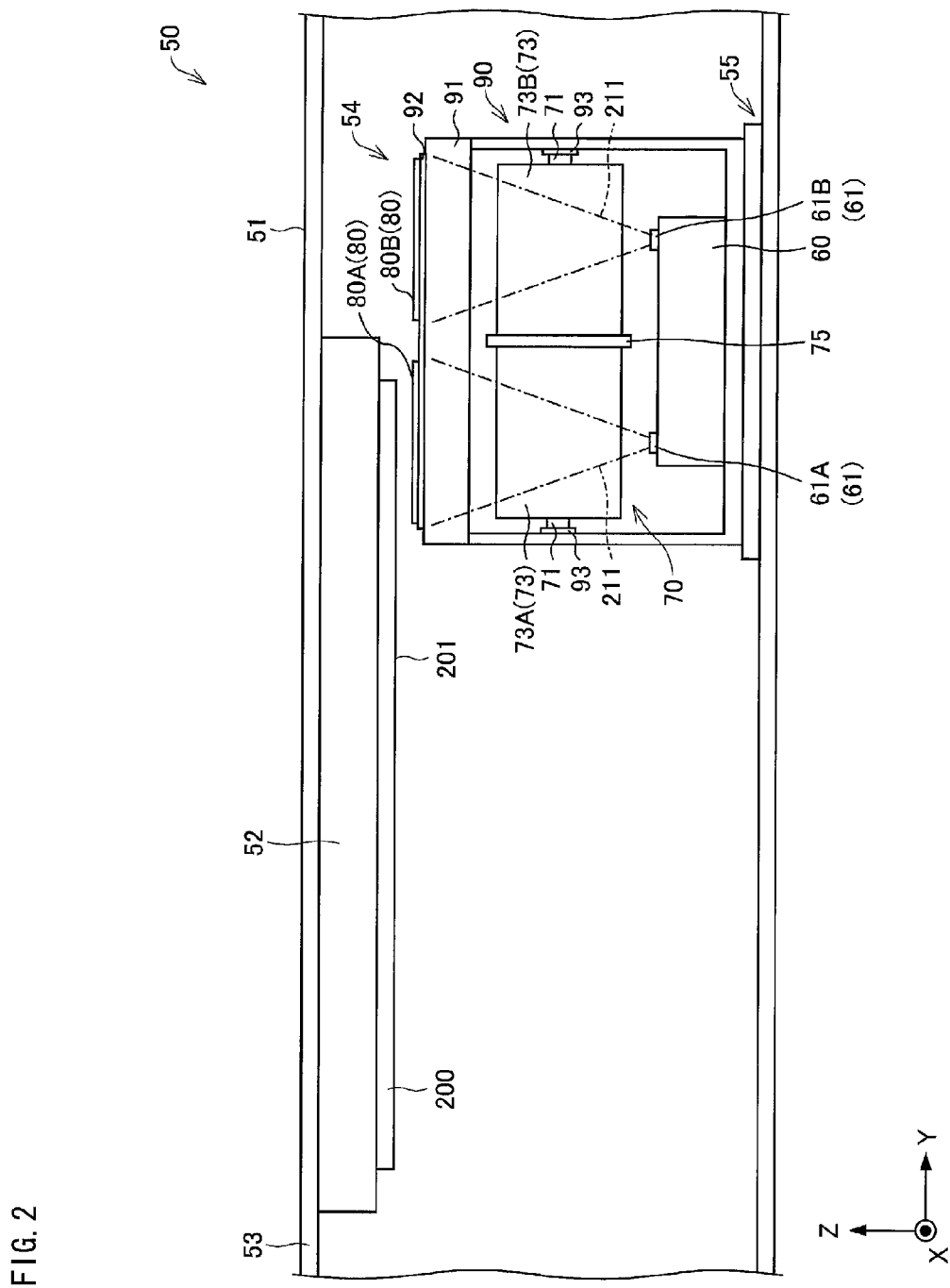
FIG. 2 is a cross-sectional view schematically illustrating a configuration of main parts of the vapor deposition device in accordance with Embodiment 1.
Figure 3:
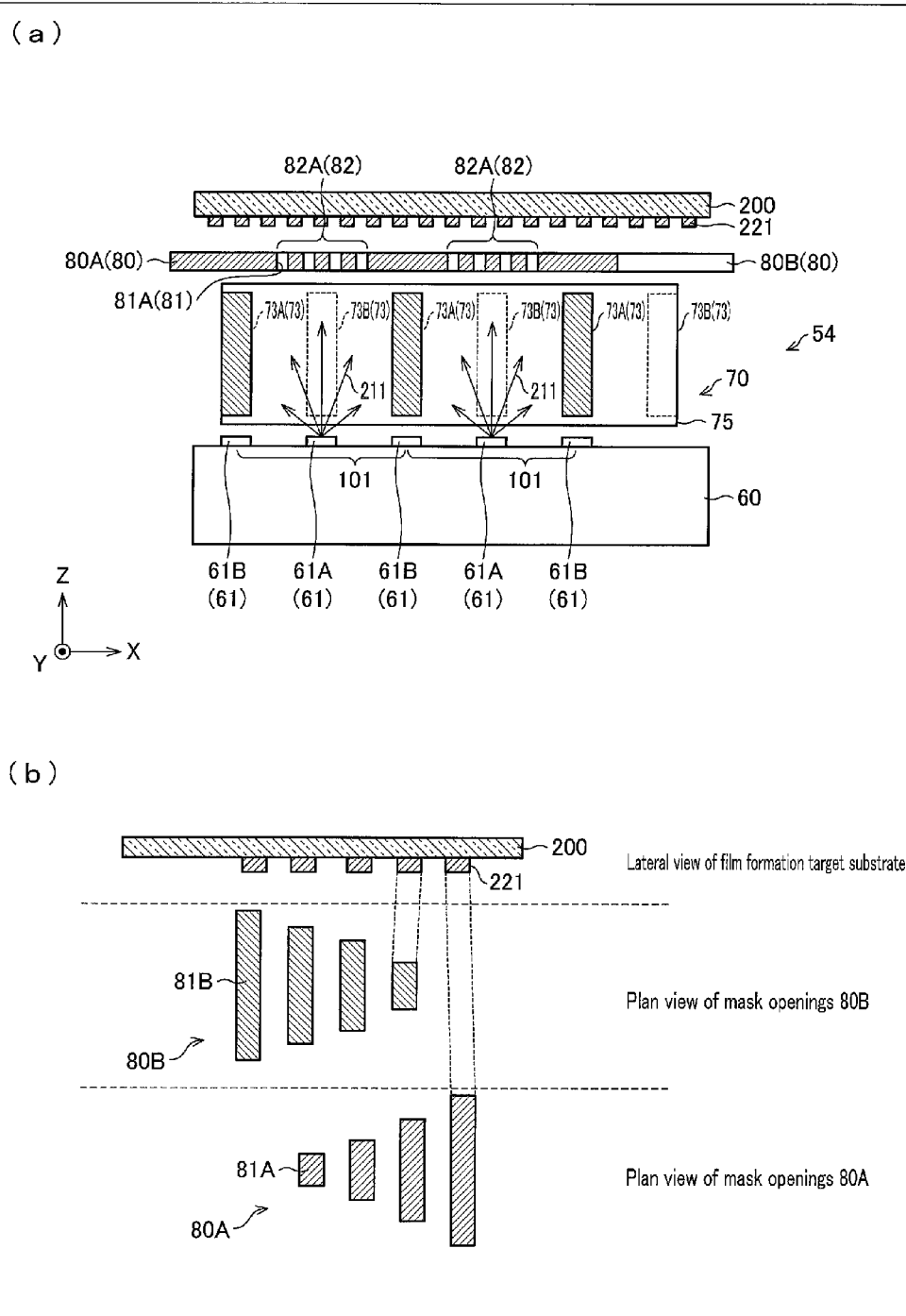
FIG. 3 is a view in which (a) is a cross-sectional view schematically illustrating main constituent elements in a vacuum chamber of the vapor deposition device in accordance with Embodiment 1 and (b) is an explanatory view schematically illustrating (i) a positional relation between mask openings in vapor deposition masks which are adjacent to each other in a Y axis direction in the vapor deposition device illustrated in (a) of FIG. 3, when viewed in a normal direction which is normal to a principal surface of each of the vapor deposition masks and (ii) a positional relation between the mask openings and vapor-deposited films formed via the mask openings.

FIG. 2 is a cross-sectional view schematically illustrating a configuration of main parts of the vapor deposition device 50 in accordance with the present embodiment. (a) of FIG. 3 is a cross-sectional view schematically illustrating main constituent elements in a vacuum chamber 51 of the vapor deposition device 50 in accordance with the present embodiment. (b) of FIG. 3 is a schematic view illustrating (i) a positional relation between mask openings 81A and 81B in vapor deposition masks 80A and 80B which are adjacent to each other in a Y axis direction in the vapor deposition device 50 illustrated in (a) of FIG. 3, when viewed in a normal direction which is normal to a principal surface of each of the vapor deposition masks 80A and 80B and (ii) a positional relation between the mask openings 81A and 81B and vapor-deposited films 221 formed via the mask openings 81A and 81B. Note that FIG. 2 is a cross section of the vapor deposition device 50 of the present embodiment taken in parallel with the scanning direction. (a) of FIG. 3 is a cross section of the vapor deposition device 50 of the present embodiment taken in parallel with the direction perpendicular to the scanning direction.

Note that, in FIG. 1 through (a) and (b) of FIG. 3, the number of the vapor deposition masks 80, the number of injection holes 61 of the vapor deposition source 60, the number of the mask openings 81, and the number of the limiting plates 73 are reduced for simplifying the drawings.

Note that, for convenience, the following description assumes that (i) a Y axis is a horizontal axis extending in a scanning direction of the film formation target substrate 200, (ii) an X axis is a horizontal axis extending in a direction perpendicular to the scanning direction of the film formation target substrate 200, and (iii) a Z axis is a vertical axis which is perpendicular to each of the X axis and the Y axis, which is a direction normal to a vapor deposition target surface of the film formation target substrate 200, and in which a vapor deposition axis orthogonal to the vapor deposition target surface extends. Note also that, for convenience, the following description assumes that the arrow side in a Z axis direction (upper side in the drawing of FIG. 1) is "an upper side", unless otherwise particularly mentioned.

As illustrated in FIG. 2, the vapor deposition device 50 in accordance with the present embodiment mainly includes a vacuum chamber 51 (a film-forming chamber), a substrate holder 52 (a substrate holding member), a substrate moving device 53, the vapor deposition unit 54, a vapor deposition unit moving device 55, an alignment observation section (not illustrated) such as an image sensor, and a control circuit (not illustrated) for controlling drive of the vapor deposition device 50. The vapor deposition unit 54 includes a vapor deposition source 60, a limiting plate unit 70, a plurality of vapor deposition masks 80, a holder 90, a shutter (not illustrated), and the like (see FIG. 1 through (a) of FIG. 3).

The substrate holder 52, the substrate moving device 53, the vapor deposition unit 54, and the vapor deposition unit moving device 55 of the above members are provided in the vacuum chamber 51.

Note that, in the vacuum chamber 51, a vacuum pump (not illustrated) is provided for vacuum-pumping the vacuum chamber 51 via an exhaust port (not illustrated) of the vacuum chamber 51 to keep a vacuum in the vacuum chamber 51 during vapor deposition.

The substrate holder 52 is a substrate holding member for holding the film formation target substrate 200. The substrate holder 52 holds the film formation target substrate 200, made of, for example, a TFT substrate, so that the vapor deposition target surface 201 (film formation target surface) faces the vapor deposition mask 80 of the vapor deposition unit 54.

The film formation target substrate 200 and the vapor deposition mask 80 are provided so as to face each other while being spaced from each other by a certain gap. Thus, the film formation target substrate 200 and the vapor deposition mask 80 have therebetween a gap having a certain height.

For the substrate holder 52, it is preferable to use, for example, an electrostatic chuck. The film formation target substrate 200 which is fixed to the substrate holder 52 by a method such as an electrostatic chuck is held by the substrate holder 52 without being bent by its own weight.

The present embodiment causes at least one of the substrate moving device 53 and the vapor deposition unit moving device 55 to carry out scanning vapor deposition by moving the film formation target substrate 200 and the vapor deposition unit 54 relatively to each other so that the Y axis direction (first direction) is the scanning direction (i.e., a moving direction by the substrate moving device 53 or the vapor deposition unit moving device 55).

The substrate moving device 53 includes, for example, a motor (not illustrated) and causes a motor drive control section (not illustrated) to drive the motor so as to move the film formation target substrate 200 held by the substrate holder 52.

The vapor deposition unit moving device 55, which includes, for example, a motor (not illustrated), causes a motor drive control section (not illustrated) to drive the motor so as to move the vapor deposition unit 54 relatively to the film formation target substrate 200.

By, for example, driving the motor (not illustrated), the substrate moving device 53 and the vapor deposition unit moving device 55 cause (i) alignment markers (not illustrated) provided in a non-opening area of the vapor deposition mask 80 and (ii) alignment markers (not illustrated) provided in a non-vapor deposition area of the film formation target substrate 200 to carry out positional correction so that positional displacement of the vapor deposition mask 80 and the film formation target substrate 200 is corrected.

The substrate moving device 53 and the vapor deposition unit moving device 55 can be, for example, a roller moving device or a hydraulic moving device.

The substrate moving device 53 and the vapor deposition unit moving device 55 can each include, for example, (i) a driving section made up of a motor (XYθ driving motor) such as a stepping motor (pulse motor), a roller, a gear, and the like and (ii) a drive control section such as a motor drive control section, and can cause the drive control section to drive the driving section so that the film formation target substrate 200 or the vapor deposition unit 54 is moved. Further, the substrate moving device 53 and the vapor deposition unit moving device 55 can each include a driving section including, for example, an XYZ stage, and can be provided so as to be movable in any of the X axis direction, the Y axis direction, and the Z axis direction.

Note, however, that at least one of the film formation target substrate 200 and the vapor deposition unit 54 only needs to be provided so as to be movable relatively to the other. In other words, at least one of the substrate moving device 53 and the vapor deposition unit moving device 55 only needs to be provided.

For example, in a case where the film formation target substrate 200 is movably provided, the vapor deposition unit 54 can be fixed to an inner wall of the vacuum chamber 51. Meanwhile, in a case where the vapor deposition unit 54 is movably provided, the substrate holder 52 can be fixed to the inner wall of the vacuum chamber 51.

As illustrated in FIG. 1 through (a) of FIG. 3, the vapor deposition unit 54 includes the vapor deposition source 60, the limiting plate unit 70, the vapor deposition mask 80, the holder 90, a shutter (not illustrated), and the like.

The vapor deposition source 60 is a container containing therein a vapor deposition material, for example. The vapor deposition source 60 can be a container directly containing therein a vapor deposition material. Alternatively, the vapor deposition source 60 can include a load-lock pipe so that a vapor deposition material is externally supplied to the vapor deposition source 60.

The vapor deposition source 60 has a quadrilateral shape, for example. The vapor deposition source 60 has a top surface (i.e., a surface facing the limiting plate unit 70) provided with a plurality of injection holes 61 (through holes, nozzles) from which the vapor deposition particles 211 are injected.

The vapor deposition source 60 generates the vapor deposition particles 211 in a form of gas by heating a vapor deposition material so that the vapor deposition material is evaporated (in a case where the vapor deposition material is a liquid material) or sublimated (in a case where the vapor deposition material is a solid material). The vapor deposition source 60 injects, from the injection holes 61 toward the limiting plate unit 70, the vapor deposition material in the form of the vapor deposition particles 211 in the form of gas.

The injection holes 61 are provided, for example, in two rows in the Y axis direction. For convenience of explanation, hereinafter, injection holes 61 in a row I are referred to as "injection holes 61A" which are provided on an upstream side in a scanning direction (i.e., moving direction of the film formation target substrate 200) indicated by the Y axis in the vapor deposition source 60. Further, injection holes 61 in a row II are referred to as "injection holes 61B" which are provided on a downstream side in the scanning direction.

As illustrated in FIG. 1, the injection holes 61A and the injection holes 61B are arranged in a staggered manner. That is, as illustrated in FIG. 2, the plurality of injection holes 61A are arranged at equal pitches in a direction in parallel with the X axis in the row I that is on the upstream side of the Y axis direction, and the plurality of injection holes 61B are arranged at equal pitches in the direction in parallel with the X axis in the row II that is on the downstream side of the Y axis direction.

Note that, in the rows I and II, the same pitches are provided between the injection holes 61A and 61B in the X axis direction (second direction). Note, however, that, when an XZ plane is viewed from the upstream side of the Y axis direction, the injection holes 61A in the row I and the injection holes 61B of the row II are alternately arranged in the X axis direction (see (a) of FIG. 3).

The vapor deposition mask 80 is a plate and has a mask surface, which is a principal surface (a surface having a largest area) of the vapor deposition mask 80 and is parallel to an XY plane.

The vapor deposition mask 80 has the principal surface provided with a plurality of mask openings 81 (openings, through holes) through which the vapor deposition particles 211 pass during vapor deposition. The plurality of mask openings 81 are provided so as to correspond to the respective sub-pixels in the vapor deposition area of the film formation target substrate 200 so that the vapor deposition particles 211 are not attached to an area other than a target sub-pixel of the film formation target substrate 200.

That is, the plurality of mask openings 81 are provided for the respective sub-pixels of the organic EL display device 1, and only the vapor deposition particles 211 which have passed through the plurality of mask openings 81 reach the film formation target substrate 200. As such, vapor-deposited films 221 in a predetermined pattern corresponding to the plurality of mask openings 81 and to the sub-pixels are formed on the film formation target substrate 200 (see (a) and (b) of FIG. 3).

Each of the vapor deposition masks 80 has, as opening areas, two mask opening group areas 82 (i) each of which includes a plurality of mask openings 81 arranged in the X axis direction and (ii) which are provided in different locations in the X axis direction.

The mask opening group areas 82 are provided so as to correspond to the respective injection holes 61 of the vapor deposition source 60 (see FIG. 1). The injection holes 61 in the X axis direction are located in the middle of the mask opening group areas 82 in the X axis direction. This makes it possible to improve vapor deposition efficiency. Moreover, by thus pairing up each of the mask opening group areas 82 with the injection hole 61 of the vapor deposition source 60, it is possible to determine a source (injection hole 61) from which the vapor deposition particles 211 come to each of the mask openings 81. Therefore, according to the configuration, it is possible to set a location of each of the mask openings 81 which location is optimal to an incoming angle of the vapor deposition particles 211 coming to the mask opening 81. This allows (i) prevention of blurred vapor deposition and (ii) improvement in vapor deposition efficiency.

As such, the vapor deposition masks 80 are provided in two rows in the Y axis direction so as to correspond to the respective vapor deposition sources 60A and 60B. Therefore, hereinafter, for convenience of explanation, the vapor deposition mask 80 provided in the row I (i.e., the upstream side in the scanning direction) so as to correspond to the vapor deposition source 60A in the row I is referred to as "vapor deposition mask 80A", and the vapor deposition mask 80 provided in the row II (i.e., the downstream side in the scanning direction) so as to correspond to the vapor deposition source 60B in the row II is referred to as "vapor deposition mask 80B". Moreover, the mask openings 81 and the mask opening group areas 82 in the vapor deposition mask 80A are referred to as "mask openings 81A" and "mask opening group areas 82A", and the mask openings 81 and the mask opening group areas 82 in the vapor deposition mask 80B are referred to as "mask openings 81B" and "mask opening group areas 82B".

With regard to the vapor deposition mask 80A and vapor deposition mask 80B, the mask openings 81A and the mask openings 81B are out of alignment in the X axis direction such that, (i) when viewed along the Y axis direction, first end parts of the mask opening group areas 82A overlap, in the X axis direction, with respective second end parts of the mask opening group areas 82B which are adjacent to the mask opening group areas 82A in the Y axis direction, the first end part and the second end part being respective two end parts of each of the mask opening group areas 82A and 82B, and (ii) a vapor-deposited film 221 formed via mask openings 81A and 81B in the first end part and in the second end part which are adjacent to each other in the Y axis direction extends on one straight line in the first direction (see FIG. 1 and (b) of FIG. 3).

As such, a vapor-deposited film 221 in one sub-pixel is formed via mask openings 81A and 81B which face each other in the first and second end parts of the vapor deposition masks 80A and 80B.

That is, as illustrated in FIG. 1 and (b) of FIG. 3, in general, mask openings 81 in different vapor deposition blocks 101 (see FIG. 3) are not located on one straight line, i.e., are out of alignment.

This is because of the following reason. In general, the mask opening 81 is located slightly closer to a corresponding injection hole 61 side, relative to the corresponding sub-pixel. This is because vapor deposition particles 211 which have come from the vapor deposition source 60 move in the X axis direction after passing through the mask opening 81 and before reaching the film formation target substrate 200 that is spaced from the mask opening 81, and the location of the mask opening 81 is determined by taking into consideration an amount of the positional displacement. The positional displacement is caused due to facts that (i) a traveling direction of the vapor deposition particles 211 has an angle with respect to the Z axis and (ii) the vapor deposition mask 80 is spaced from the film formation target substrate 200. Therefore, the mask opening 81 is surely located closer to the injection hole 61 side relative to the corresponding sub-pixel. From this, in general, mask openings 81 in the different vapor deposition blocks 101 are to be positionally displaced to each other in the X axis direction.

In the present embodiment, in an area (hereinafter, referred to as "overlapping area 83") in which the mask opening group area 82A and the mask opening group area 82B overlap with each other in the X axis direction when viewed along the Y axis direction, the mask openings are formed to have, in the Y axis direction, opening lengths which become shorter toward an outer side of each of the mask opening group areas 82 when viewed in a normal direction which is normal to a principal surface of each of the vapor deposition masks 80 so that vapor-deposited films 221 corresponding to the respective sub-pixels are to have identical thicknesses.

Note that "to have, in the Y axis direction, opening lengths . . . when viewed in a normal direction which is normal to a principal surface of each of the vapor deposition masks 80" does not mean a length of the mask opening 81 itself in the Y axis direction but indicates a substantial opening length in the Y axis direction of an actual opening in the vapor deposition mask 80 that is viewed in the normal direction which is normal to the principal surface of the vapor deposition mask 80 (i.e., a length in the Y axis direction of an opening area through which the vapor deposition particles 211 can pass through). Note, however, that, in the present embodiment, the opening length in the Y axis direction when viewed in the normal direction is equal to the length in the Y axis direction of the mask opening 81 provided in the vapor deposition mask 80.

Figure 4:
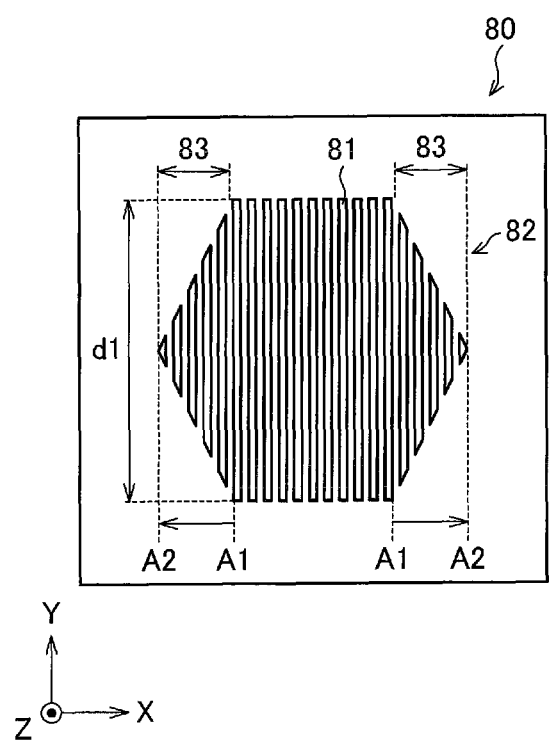
FIG. 4 is a plan view illustrating a pattern of openings of a mask opening group in a vapor deposition mask used in Embodiment 1.

FIG. 4 is a plan view illustrating a pattern of openings of the mask opening group area 82 in the vapor deposition mask 80.

As illustrated in FIG. 4, the mask openings 81 in each of the mask opening group areas 82 extend in parallel with each other at equal pitches in the X axis direction. Meanwhile, the mask openings 81 in the overlapping area 83 are formed so that opening lengths d1 in the Y axis direction in each of the vapor deposition masks 80 become shorter.

In the present embodiment, the mask opening group area 82 is formed such that (i) the opening lengths d1 in the overlapping area 83 between A1 and A2 in FIG. 4 vary from 285 mm to 15 mm at a constant change ratio and (ii) total opening lengths in the Y axis direction of the vapor deposition mask 80A and the vapor deposition mask 80B are all 300 mm.

Figure 5:
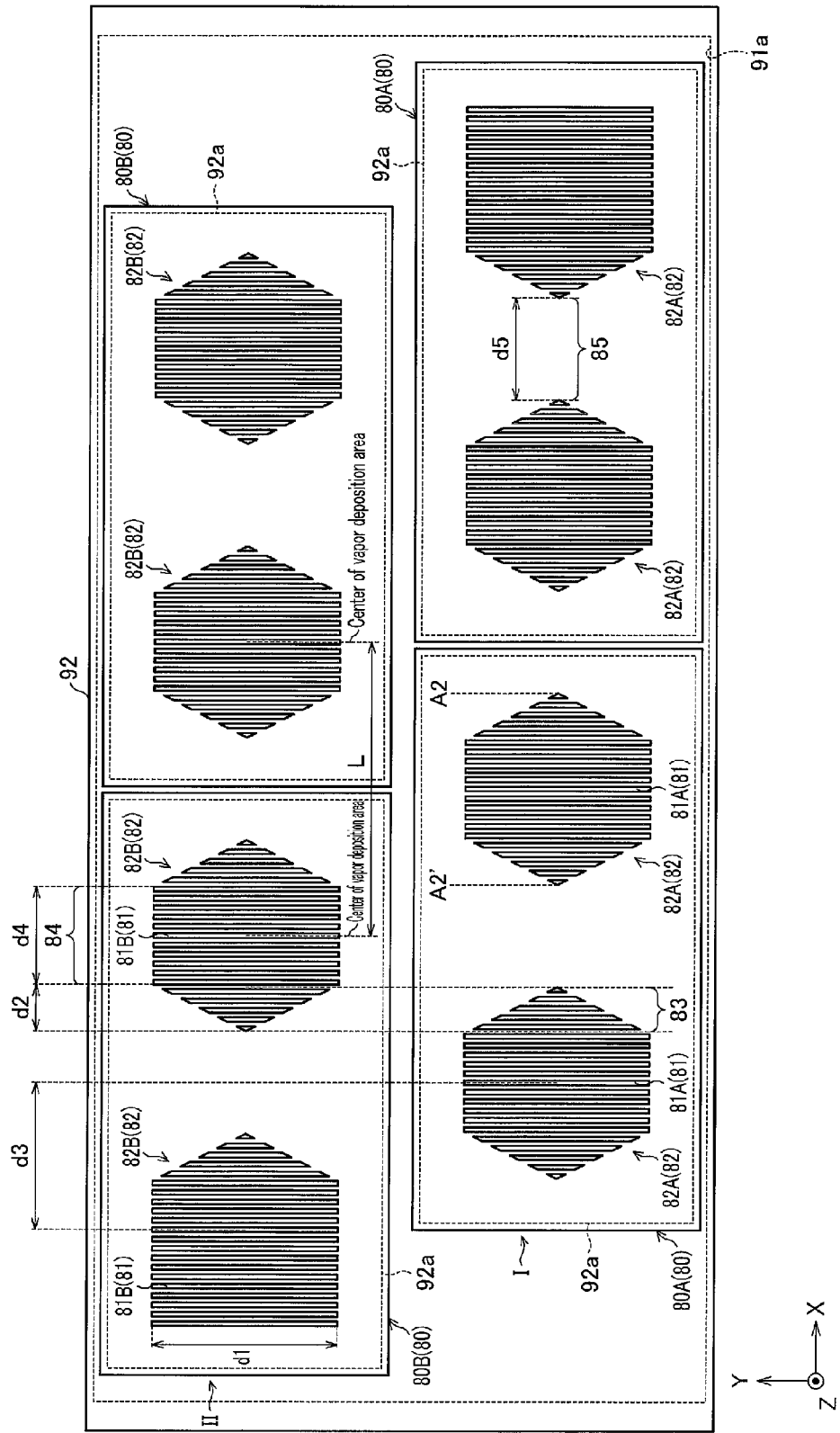
FIG. 5 is a plan view illustrating an example of a mask pattern of the vapor deposition mask in accordance with Embodiment 1.

FIG. 5 is a plan view illustrating an example of a mask pattern of the vapor deposition mask 80 in accordance with the present embodiment.

In the present embodiment, as an example, d1=300 mm, d2=d4=d5=50 mm, d3=100 mm, in FIG. 5. Note that the length d1 is a maximum opening length in the Y axis direction of the mask opening group area 82 and is equal to (i) an opening length in the Y axis direction of an area (hereinafter, referred to as "non-overlapping area 84") in the mask opening group area 82 which non-overlapping area 84 is on one straight line extending in the Y axis direction on which line no other mask openings 81 exist and (ii) a total opening length of the vapor deposition mask 80A and the vapor deposition mask 80B in the Y axis direction. Note that the opening lengths of the mask openings 81 in the overlapping area 83 are as described above with reference to FIG. 4. The length d2 is a width of the overlapping area 83 in the X axis direction and is a width in the X axis direction by which the mask opening group area 82A overlaps with the mask opening group area 82B. The length d3 is a pitch in the X axis direction between the mask opening group area 82A and the mask opening group area 82B which are adjacent to each other, and d3=(d4/2)+d2+(d5/2). The length d4 is a width of the non-overlapping area 84 in the X axis direction, which non-overlapping area 84 is on one straight line extending in the Y axis direction on which line no other mask openings 81 exist. The length d5 is a width of the shielding area 85 in the X axis direction between mask opening group areas 82 adjacent to each other in the X axis direction. Note that any of the numerical values is a design example, and the present embodiment is not limited only to the numerical values.

The mask opening group areas 82 which are adjacent to each other in the X axis direction are spaced from each other via the shielding area 85 that corresponds to at least one pixel, from the viewpoint of preventing blurred vapor deposition. Specifically, for example, the mask opening group areas 82 are spaced from each other by 5 mm or more.

In the boundary section between the mask opening group areas 82 which are adjacent to each other in the X axis direction, vapor deposition particles 211 which have come from two injection holes 61 corresponding to the respective mask opening group areas 82 tend to be mixed. However, the mask opening group areas 82 which are thus adjacent to each other are provided via the shielding area 85 corresponding to at least one pixel, and this makes it possible to prevent blurred vapor deposition, in particular, blurred vapor deposition in the boundary section between the mask opening group areas 82 which are adjacent to each other in the X axis direction, as above described.

In FIG. 5, an example is illustrated in which four vapor deposition masks 80 (i.e., two in the X axis direction and two in the Y axis direction) are provided each of which has two mask opening group areas 82 (i) each of which has the opening pattern illustrated in FIG. 4 and (ii) which are arranged in the X axis direction.

Note, however, that FIG. 5 merely indicates that the plurality of vapor deposition masks 80 are provided in the X axis direction and the Y axis direction, and the number of the vapor deposition masks 80 in the X axis direction and the number of the vapor deposition masks 80 in the Y axis direction are not limited to the above described ones. In a case where a large-sized substrate is employed, a number of vapor deposition masks 80 are arranged in the X axis direction in order to reduce a size of the vapor deposition mask 80.

That is, the number of the vapor deposition masks 80 in the vapor deposition unit 54 is determined as appropriate in accordance with a size of the film formation target substrate 200 and the number of mask opening group areas 82 provided in one (1) vapor deposition mask 80. In this case, the number of vapor deposition masks 80 in the vapor deposition unit 54 is determined such that the total length in the Y axis direction of vapor deposition masks 80 arranged in the Y axis direction becomes shorter than a length of the vapor deposition area of the film formation target substrate 200 in the Y axis direction. Moreover, the number of vapor deposition masks 80 in the vapor deposition unit 54 is determined such that the total length of vapor deposition masks 80 in the X axis direction becomes longer than a length of the vapor deposition area of the film formation target substrate 200 in the X axis direction. Thus, the mask openings 81 can be provided in the entire vapor deposition area of the film formation target substrate 200 in the X axis direction.

Note that, in order to align vapor deposition masks 80 in different rows such that a vapor-deposited film 221 is formed on one straight line via mask openings 81 in the end parts of the mask opening group areas 82 of the vapor deposition masks 80, the vapor deposition masks 80 are preferably arranged as close as possible to each other in the Y axis direction. As the number of vapor deposition masks 80 in the Y axis direction increases, the number of members, such as the number of injection holes 61 and the number of limiting plates 73 and 75 (later described), other than the vapor deposition mask 80 increases accordingly. Therefore, the number of vapor deposition masks 80 in the Y axis direction (i.e., the number of rows) is preferably suppressed to two by sequentially arranging the vapor deposition masks 80 in the X axis direction while avoiding a gappy pattern.

Note, however, that the present embodiment is not limited to this, and the total length in the Y axis direction of the vapor deposition masks 80 arranged in the Y axis direction can exceed the length of the vapor deposition area of the film formation target substrate 200 in the Y axis direction.

A film thickness of the vapor-deposited film 221 formed by the scanning vapor deposition method can be obtained by the following formula:

Film thickness [Å]=vapor deposition rate [Å/s]×opening length [mm] of vapor deposition mask 80 in Y axis direction/carrying speed [mm/s].

For example, in a case where (i) the organic EL display device 1 is produced by scanning vapor deposition with an in-line device configuration and (ii) vapor-deposited films 221 having identical film thicknesses are to be formed by increasing the carrying speed of the film formation target substrate 200 so that the carrying speed becomes identical with those in the previous and the following steps, the vapor deposition rate needs to be heightened or the opening length of the vapor deposition mask 80 in the Y axis direction needs to be increased. In a case where it is difficult to heighten the current vapor deposition rate because of a reason such as (i) deterioration of material or (ii) a substrate which is excessively heated by radiant heat, the opening length of the vapor deposition mask 80 in the Y axis direction needs to be increased. Therefore, for example, (i) in a case where the carrying speed needs to be increased in a situation where the current vapor deposition rate cannot be heightened, (ii) in a case where the scanning vapor deposition needs to be carried out with a process that is of very low rate due to the circumstances, or (iii) in a case where a vapor-deposited film 221 having a very large thickness needs to be formed, it is possible to employ a vapor deposition unit 54 whose total length of the vapor deposition mask 80 in the Y axis direction exceeds the substrate length, depending on the circumstances.

The limiting plate unit 70 is provided between the vapor deposition source 60 and the vapor deposition masks 80 so as to be spaced from the vapor deposition source 60 and from the vapor deposition masks 80.

As illustrated in FIG. 1 and (a) of FIG. 3, the limiting plate unit 70 includes a plurality of limiting plates 73 (first limiting plate) which are provided (i) in the X axis direction and (ii) in respective locations in the X axis direction. The limiting plates 73 are made of respective plate members having identical sizes.

When viewed in the normal direction which is normal to the principal surfaces of the vapor deposition masks 80, the plurality of limiting plates 73 are (i) provided so as to each extend in parallel with the Y axis and (ii) arranged in parallel with each other in the X axis direction at equal pitches. This means that, when viewed in the normal direction (i.e. direction in parallel with the Z axis), a limiting plate opening 74 serving as an opening area is provided between any two limiting plates 73 that are adjacent to each other in the X axis direction.

Note that, also in this part, limiting plates 73 in the row I provided on the upstream side in the scanning direction of the limiting plate unit 70 are referred to as "limiting plates 73A", and limiting plates 73 in the row II provided on the downstream side in the scanning direction are referred to as "limiting plates 73B". Moreover, limiting plate openings 74 provided between adjacent limiting plates 73A are referred to as "limiting plate openings 74A", and limiting plate openings 74 provided between adjacent limiting plates 73B are referred to as "limiting plate openings 74B". Further, a limiting plate row 72 in the row I is referred to as a "limiting plate row 72A", and a limiting plate row 72 in the row II is referred to as a "limiting plate row 72B".

As illustrated in FIG. 1, the limiting plates 73A are (i) provided so that the injection holes 61A in the row I are each provided between two adjacent limiting plates 73A in the X axis direction and (ii) arranged in the X axis direction and in respective locations in the X axis direction. The limiting plates 73B are (i) provided so that the injection holes 61B in the row II are each provided between two adjacent limiting plates 73B in the X axis direction and (ii) arranged in the X axis direction and in respective locations in the X axis direction.

Therefore, when viewed in the normal direction, the limiting plates 73A and the limiting plates 73B are provided in a staggered manner as is the case of the injection holes 61.

One vapor deposition block 101 is constituted by (i) a pair of limiting plates 73 adjacent to each other in the X axis direction, (ii) one injection hole 61 provided between the pair of limiting plates 73, (iii) one mask opening group area 82 including a plurality of mask openings 81 provided between the pair of limiting plates 73. Therefore, according to the present embodiment, when viewed in the normal direction, (i) a plurality of vapor deposition blocks 101 are provided in a delta sequence and (ii) vapor deposition blocks 101 in the row I and vapor deposition blocks 101 in the row II are out of alignment in the X axis direction by ½ pitch (specifically, by half of each of pitches at which the limiting plates 73 are adjacent to each other in the X axis direction).

The limiting plates 73 are thus provided so that the injection holes 61 of the vapor deposition source 60 correspond to the respective limiting plate openings 74. A location in the X axis direction of each of the injection holes 61 corresponds to a center part in the X axis direction of a region between two adjacent limiting plates 73. The pitches at which the limiting plate openings 74 are provided (i) correspond to respective mask opening group areas 82 and (ii) are larger than the pitches at which the mask openings 81 are provided. This means that, when viewed in the normal direction, a plurality of mask openings 81 are provided between two limiting plates 73 adjacent to each other in the X axis direction.

The limiting plates 73 are provided so that principal surfaces of the respective limiting plates 73 are each a YZ plane, and are normal to the principal surfaces of the plurality of vapor deposition masks 80.

Between (i) the limiting plates 73A in the row I and (ii) the limiting plates 73B in the row II, a limiting plate 75 or a partition, any of which serves as a second limiting plate, is preferably provided along the X axis direction.

FIG. 1 through (a) of FIG. 3 illustrate a case where the limiting plate 75 lying in parallel with the X axis is provided between (i) the limiting plates 73A and (ii) the limiting plates 73B.

The limiting plate 75 is connected to (i) end surfaces of the limiting plates 73A on the row II side and (ii) end surfaces of the limiting plates 73B on the row I side. Although a length of the limiting plate 75 in the Z axis direction is not particularly limited, the length is preferably (i) equal to or greater than lengths of the limiting plates 73A and 73B in the Z axis direction and (ii) configured such that an upper-side end part of the limiting plate 75 in the Z axis direction protrudes toward the vapor deposition masks 80 further than do upper-side end parts of the limiting plates 73A and 73B in the Z axis direction and that a lower-side end part of the limiting plate 75 in the Z axis direction protrudes toward the vapor deposition source 60 further than do lower-side end parts of the limiting plates 73A and 73B in the Z axis direction.

The limiting plate 75 functions as a supporting member for supporting the limiting plates 73A and 73B, and prevents vapor deposition particles 211, which have entered the limiting plate unit 70, from entering the vapor deposition blocks 101 in rows other than a row from which the vapor deposition particles 211 have come.

Vapor deposition particles 211 injected from the vapor deposition source 60 (i) pass through spaces between the limiting plates 73, (ii) pass through the mask openings 81 which are provided in the vapor deposition masks 80, and then (iii) are deposited on the film formation target substrate 200.

Depending on angles at which the vapor deposition particles 211 have entered the limiting plate unit 70, the limiting plate unit 70 selectively captures the vapor deposition particles 211 thus entered. By capturing at least part of the vapor deposition particles 211 that have collided with the limiting plates 73 and 75, the limiting plate unit 70 limits movements, toward the limiting plates 73 and 75, of vapor deposition particles 211 which have been injected from the vapor deposition source 60.

This allows the limiting plate unit 70 to (i) limit, to those within a certain range, angles at which the vapor deposition particles 211 enter the mask openings 81 of the vapor deposition masks 80 and (ii) prevent the vapor deposition particles 211 from being obliquely attached to the film formation target substrate 200.

Note that limiting plates 73 and 75 are unheated or are cooled by a heat exchanger (not illustrated) so as to block obliquely scattering vapor deposition components. This causes the limiting plates 73 and 75 to have a temperature lower than those of the injection holes 61 (more strictly speaking, a temperature lower than a vapor deposition particle generation temperature at which a vapor deposition material turns into gas).

Therefore, the limiting plate unit 70 can, as necessary, include a cooling mechanism (not illustrated) for cooling the limiting plates 73 and 75. This allows unnecessary vapor deposition particles 211, which move in directions outside a desired angle, to be captured (cut) by being cooled by the limiting plates 73 and 75 and therefore solidified.

The holder 90 is a holding member for holding the vapor deposition source 60, the limiting plate unit 70, and the vapor deposition masks 80.

The holder 90 includes, as vapor deposition mask holding members, (i) a mask holder 91 (mask frame), (ii) a mask tray 92, and (iii) a mask holder fixing member (not illustrated).

As illustrated in FIGS. 1, 2 and 5, the vapor deposition masks 80 are provided on the mask tray 92 which is provided on the mask holder 91. The mask holder 91 holds the vapor deposition masks 80 by holding the mask tray 92 which directly holds the vapor deposition masks 80. The vapor deposition source 60 is provided under the vapor deposition masks 80.

The mask holder 91 is held and fixed by the mask holder fixing member (not illustrated). Note that neither the mask holder 91 nor the mask tray 92 is limited to any particular shape, provided that the vapor deposition masks 80 can be held and fixed while the vapor deposition masks 80 are spaced from the vapor deposition source 60 and from the limiting plate unit 70 by certain distances.

As illustrated in FIGS. 1 and 5, the mask holder 91 has, for example, a frame shape whose center part is an opening. The mask tray 92 also has, for example, a frame shape whose center part is an opening.

Parts of the mask tray 92, which parts directly face the vapor deposition masks 80, have openings 92a. The mask tray 92 holds the vapor deposition masks 80 at outer edges of the vapor deposition masks 80.

Parts of the mask holder 91, which parts directly' face the mask opening group areas 82 of the vapor deposition masks 80, have openings 91a. The mask holder 91 holds, at outer edges of the mask tray 92, the mask tray 92 on which the vapor deposition masks 80 are provided.

Note, however, that the present embodiment is not limited to such a configuration. Alternatively, the vapor deposition masks 80 can be directly held by the mask holder 91. For example, even without the mask tray 92, it would be still possible to hold the vapor deposition masks 80 in a case where the mask holder 91 is configured such that beams for holding the vapor deposition masks 80 are provided (i) at a frame part constituting outer edges (outer frame) of the mask holder 91 and (ii) inside the opening of the frame part. Meanwhile, the use of the mask tray 92 allows the vapor deposition masks 80 to be removed, replaced or the like together with the mask tray 92, and therefore makes maintenance easy.

The holder 90 includes supporting members 93, a pair of sliding devices (not illustrated) and the like in order to support the limiting plate unit 70.

The supporting members 93 are provided, for example, so as to face each other at both end parts of the holder 90 in the X axis direction. In a case where the sliding devices are to be provided, (i) the sliding devices are to be provided so as to face each other at the both end parts of the holder 90 and (ii) the supporting members 93 are to be provided on respective surfaces of the sliding devices, which surfaces face each other. By providing the sliding devices, the supporting members 93 are enabled to slide to be displaced in the Z axis direction and in the X axis direction while facing each other. Movements of the supporting members 93 are controlled by the sliding devices in combination with a limiting plate control device (not illustrated).

The limiting plate unit 70 includes, for example, a frame-like holding body (not illustrated). At both end parts of the frame-like holding body in the X axis direction, supporting sections 71 are provided so as to be detachably provided on the respective supporting members 93. This allows the limiting plate unit 70 to be detached from the holder 90, so that it is possible to periodically collect a vapor deposition material which is accumulated on the limiting plate unit 70.

The vapor deposition source 60, the limiting plate unit 70 and the vapor deposition masks 80 are integrally held by the holder 90, so that respective locations of the vapor deposition source 60, the limiting plate unit 70 and the vapor deposition masks 80 relative to each other are fixed.

Note, however, that in a case where the film formation target substrate 200 is moved relative to the vapor deposition unit 54, the respective locations of the vapor deposition source 60, the limiting plate unit 70 and the vapor deposition masks 80 only need to be fixed relative to each other. That is, in such a case, the vapor deposition source 60, the limiting plate unit 70 and vapor deposition masks 80 do not need to be held by one holder 90, nor do they necessarily need to be integrated with each other.

The vapor deposition source 60, the limiting plate unit 70 and the vapor deposition masks 80 are provided in this order from a vapor-deposition-source-60 side so as to face each other while being spaced from each other by certain gaps. Note that the gaps between the vapor deposition source 60, the limiting plate unit 70 and the vapor deposition masks 80 are not limited to any particular distance, but can be set to any distance.

In order to prevent vapor deposition particles from coming toward the film formation target substrate 200, it is desirable to use a shutter (not illustrated) to control whether vapor deposition particles 211 reach the vapor deposition masks 80.

Therefore, in order to control, for example, whether vapor deposition particles 211 reach the vapor deposition masks 80, the shutter (not illustrated) can be provided as necessary between the vapor deposition source 60 and the limiting plate unit 70 such that the shutter can be moved back and forth (can be inserted and drawn out) in accordance with a vapor deposition OFF signal or a vapor deposition ON signal.

By providing the shutter as necessary between the vapor deposition source 60 and the limiting plate unit 70, the vapor deposition particles 211 are prevented from being deposited on the non-vapor deposition area which is not subjected to vapor deposition. Note that the shutter can be integrated with the vapor deposition source 60 or can be provided apart from the vapor deposition source 60.

According to the present embodiment, the vapor deposition masks 80A in the row I and the vapor deposition masks 80B in the row II are thus out of alignment in the X axis direction such that, when viewed along the Y axis direction, the end parts of the mask opening group areas 82A overlap, in the X axis direction, with the end parts of the mask opening group areas 82B (see, for example, FIGS. 1 and 5). Moreover, the mask opening group areas 82 are formed such that, in the overlapping area 83 in which the mask opening group area 82A and the mask opening group area 82B overlap with each other in the X axis direction when viewed along the Y axis direction, (i) the opening lengths d1 in the Y axis direction become shorter toward the outer side of each of the mask opening group areas 82 when viewed in the normal direction which is normal to the principal surfaces of the vapor deposition masks 80 and (ii) total opening lengths in the Y axis direction of the vapor deposition mask 80A and the vapor deposition mask 80B are always identical regardless of the locations of the mask openings 81 in the X axis direction.

Figure 6:
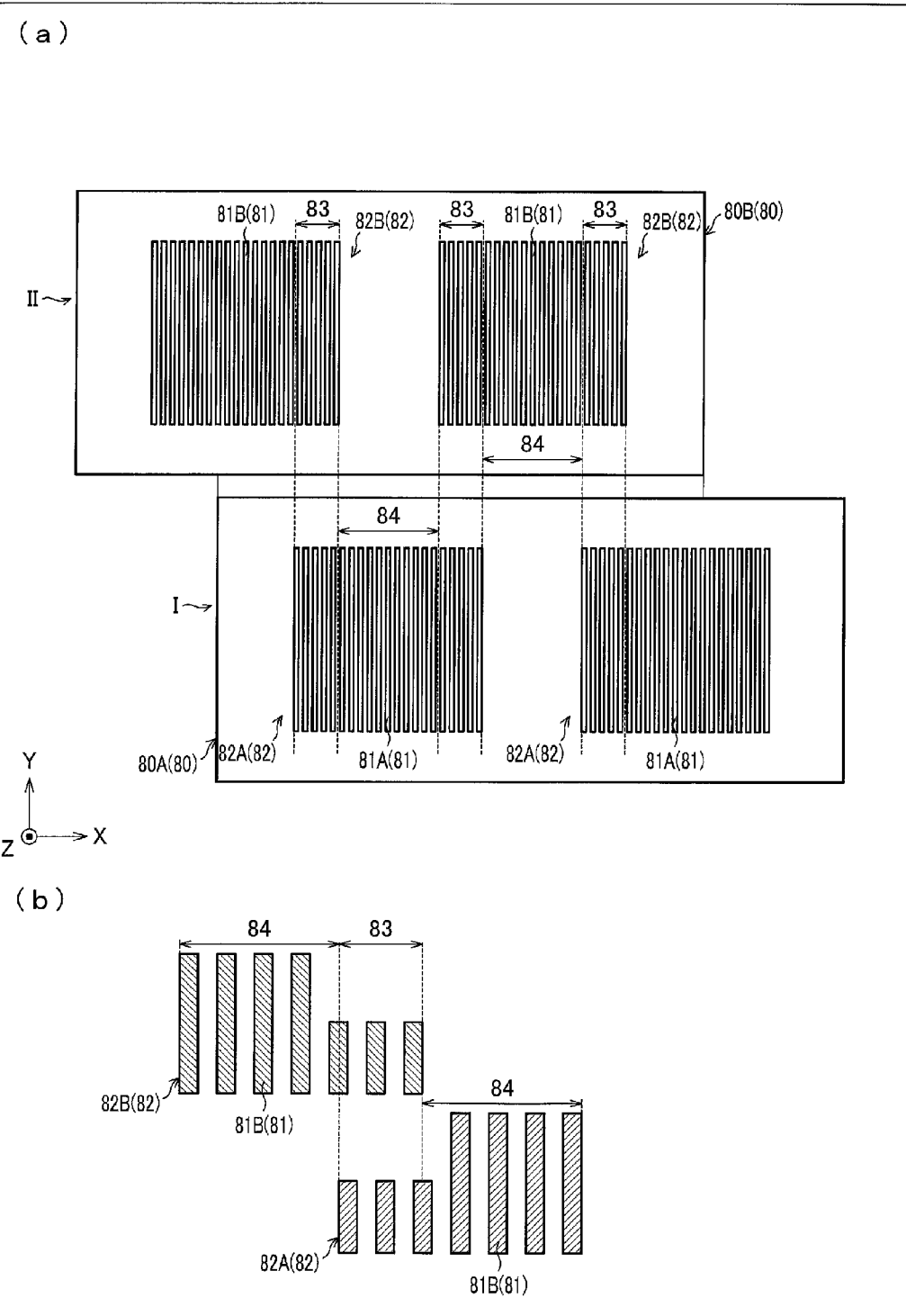
FIG. 6 is a plan view illustrating, in (a) and (b), Comparative Examples 1 and 2, respectively, in which vapor deposition masks each of which has mask opening group areas including mask openings in identical shapes are arranged in a manner similar to that of FIG. 1.
Figure 7:
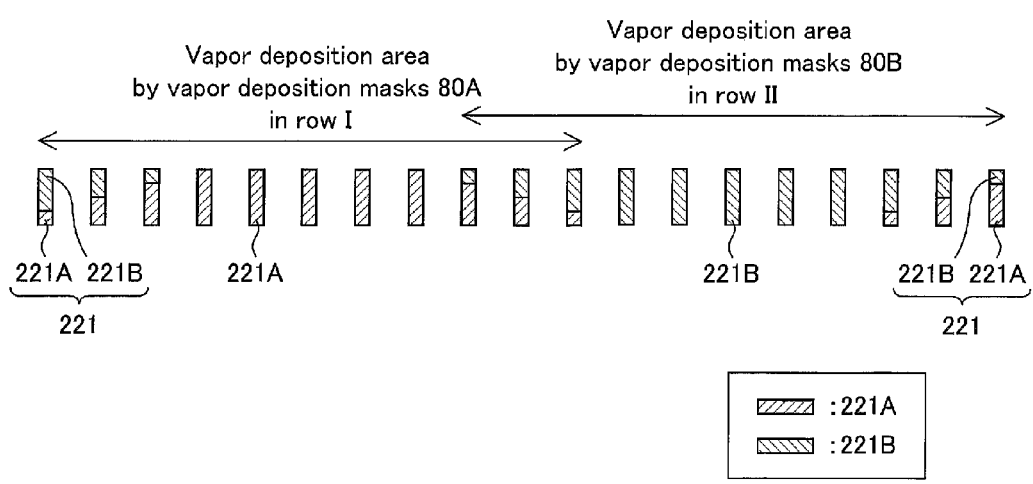
FIG. 7 is a plan view illustrating a configuration of a vapor-deposited film which has been formed, by vapor deposition carried out with use of the vapor deposition mask illustrated in FIG. 1, in a vapor deposition area corresponding to vapor deposition masks in a row I and in a vapor deposition area corresponding to vapor deposition masks in a row II.

Meanwhile, (a) and (b) of FIG. 6 are plan views illustrating examples, serving as Comparative Examples 1 and 2 respectively, in which vapor deposition masks 80 each of which has mask opening group areas 82 including mask openings 81 in identical shapes are arranged in a manner similar to that of FIG. 1. FIG. 7 is a plan view illustrating a configuration of vapor-deposited films 221 which have been formed, by vapor deposition carried out with use of the vapor deposition masks 80 illustrated in FIG. 1, in a vapor deposition area corresponding to vapor deposition masks 80A in a row I and in a vapor deposition area corresponding to vapor deposition masks 80B in a row II.

In FIG. 7, vapor-deposited films 221A are vapor-deposited films 221 formed via the vapor deposition masks 80A, whereas vapor-deposited films 221B are vapor-deposited films 221 formed via the vapor deposition masks 80B.

(a) of FIG. 6 illustrates the vapor deposition masks 80 of Comparative Example 1. In overlapping areas 83 that are areas in each of which a vapor deposition area corresponding to a vapor deposition mask 80A in the row I and a vapor deposition area corresponding to a vapor deposition mask 80B in the row II overlap with each other, total opening lengths in the Y axis direction of mask openings 81A and mask openings 81B are approximately twice as long as those in non-overlapping areas 84. This causes a film thickness of vapor-deposited films 221 in the overlapping areas 83 to be also approximately twice as thick as that in the non-overlapping areas 84. Therefore, it is not appropriate to cause the vapor deposition masks of Comparative Example 1 to overlap with each other.

(b) of FIG. 6 illustrates the vapor deposition masks 80 of Comparative Example 2. Since total opening lengths in the overlapping area 83 are identical unlike the case of Comparative Example 1, a film thickness in the overlapping area 83 is uniform. However, the following problem arises. For example, in a case where a vapor deposition rate of a vapor deposition source 60A corresponding to mask opening group areas 82A is higher than a set value by 5% because of some type of trouble, a film thickness of vapor-deposited films 221 corresponding to the overlapping area 83 increases by 2.5%. A drastic change in thickness of films formed via the vapor deposition masks 80A and the vapor deposition masks 80B are easily recognizable to a human eye. The overlapping area 83 is thus recognized in the form of a stripe on a display, so that the display is then defective.

In contrast, according to the present embodiment, at any point in the X axis direction, (i) total opening lengths are identical and (ii) film thicknesses in the overlapping area 83 are uniform. Moreover, since the mask openings 81A and 81B in the overlapping area 83 are configured to become shorter toward the outer side of each of the mask opening group areas 82, for example, even in a case where a vapor deposition rate of the vapor deposition source 60A corresponding to the mask opening group areas 82A is higher than a set value by 5%, vapor-deposited films 221 corresponding to the overlapping area 83 are formed such that a variance in film thickness becomes smaller toward the outer side of each of the mask opening group areas 82 (the variance is herein 5% to 0%). This causes a variance in film thickness to be hardly recognizable to a human eye, so that the overlapping area 83 is not recognized in the form of stripes on the display. According to the present embodiment, (i) even if a variance in film thickness occurs, the variance is hardly recognizable and (ii) it is possible to form a highly-fine pattern of vapor-deposited films having a uniform film thickness.

According to the present embodiment, it is thus possible to realize, by dividing the mask openings 81 which correspond to the respective sub-pixels arranged in the X axis direction of the film formation target substrate 200, scanning vapor deposition in which vapor deposition masks 80 smaller than a conventional one are used. This allows the vapor deposition masks 80 to be lighter in weight than the conventional one, and therefore makes it possible to reduce vapor deposition misalignment which occurs as a result of bending of the vapor deposition masks 80. Hence, it is possible to reduce blurred vapor deposition deriving from bending of the vapor deposition masks 80, and therefore allows an organic EL display device 1 without color mixture to be realized.

According to the present embodiment, (i) the vapor deposition masks 80A and 80B, which are adjacent to each other in the Y axis direction, are thus out of alignment in the X axis direction and (ii) in the overlapping areas 83, the opening lengths d1 in the Y axis direction become shorter toward the outer side of each of the mask opening group areas 82 when viewed in the normal direction which is normal to the principal surfaces of the vapor deposition masks 80 (i.e. becomes shorter from A1 to A2 in FIG. 4). This allows the opening lengths d1 to be gradually changed in the boundary section between the mask opening group areas 82A and the mask opening group areas 82B, which boundary section is to be a mask relaying section.

Therefore, even in a case where the mask openings 81 corresponding to the respective sub-pixels arranged in the X axis direction of the film formation target substrate 200 are divided so as to thus carry out scanning vapor deposition by using the vapor deposition masks 80 smaller in size than a conventional one, it is still possible to carry out uniform vapor deposition in which no block separation occurs at the boundary section between (i) the mask opening group areas 82A and (ii) the mask opening group areas 82B.

In this case, the mask opening group areas 82A and 82B, which are adjacent in the Y axis direction, are out of alignment in the X axis direction so as to overlap each other by one pixel or more at the end parts. This reliably prevents block separation at the boundary section, and therefore allows vapor deposition to be carried out more uniformly.

Note that the numbers of mask openings 81A and 81B in the mask opening group areas 82A and 82B are limited. Therefore, an upper limit of a width by which a mask opening group area 82A and a corresponding mask opening group area 82B overlap each other is of course limited in accordance with the number of mask openings 81A and 81B in the mask opening group areas 82A and 82B.

FIGS. 1, 4 and 5 illustrate a case where the mask opening group areas 82 of the vapor deposition masks 80 each have a substantially hexagonal shape.

However, the mask opening group areas 82 are not limited to the substantially hexagonal shape, provided that (i) the opening lengths d1 in the Y axis direction becomes shorter toward the outer side of each of the mask opening group areas 82 when viewed in the normal direction which is normal to the principal surfaces of the vapor deposition masks 80 and (ii) total opening lengths in the Y axis direction of adjacent vapor deposition masks 80 are always identical regardless of the locations of the mask openings 81 in the X axis direction.

Figure 12:
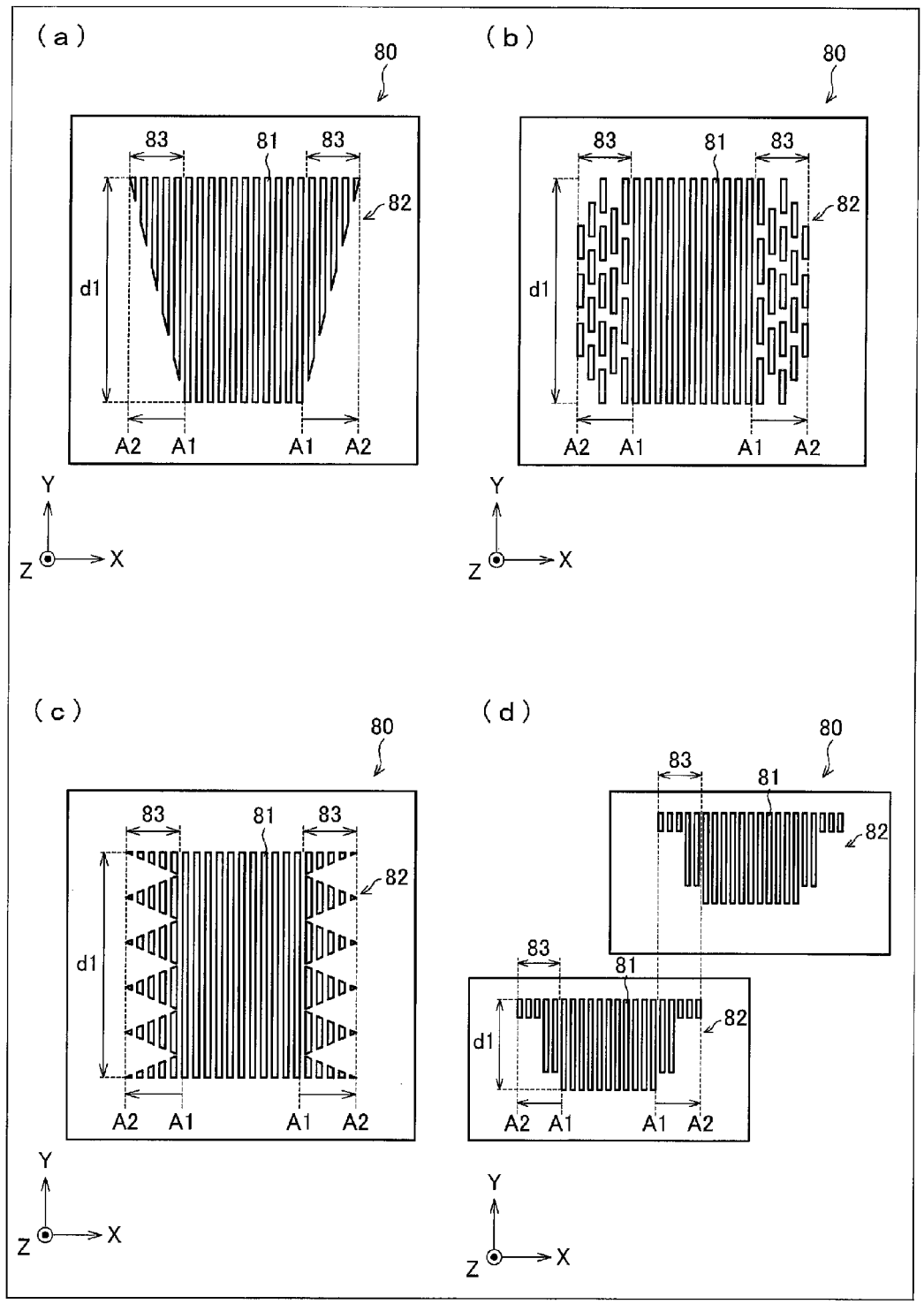
FIG. 12 is a plan view mainly illustrating, in each of (a) through (d), another example of a pattern shape of a mask opening group area in the vapor deposition mask, in accordance with Embodiment 1.

(a) through (d) of FIG. 12 are plan views mainly illustrating other pattern shapes of the mask opening group areas 82 in the vapor deposition masks 80 in accordance with the present embodiment.

As illustrated in (a) of FIG. 12, a mask opening group area 82 can be formed to have, for example, a trapezoidal shape. As illustrated in (b) of FIG. 12, a mask opening group area 82 can have, for example, a shape in which a plurality of mask openings 81 differing in opening length are intermittently formed in overlapping areas 83. As illustrated in (c) of FIG. 12, a mask opening group area 82 can have a shape in which outer edges of the mask opening group area 82 are formed in a zigzag pattern in overlapping areas 83.

A change ratio of an opening length in overlapping areas 83 does not need to be constant. Specifically, in the overlapping areas 83, the opening lengths do not necessarily need to be continuously and gradually become shorter toward an outer side of each of mask opening group areas 82 (i.e. from A1 to A2). As illustrated in (d) of FIG. 12, mask opening group areas 82 can have a step-like form in overlapping areas 83 or can be shaped such that the opening lengths change to become shorter in stages in the overlapping area 83. The shape of a mask opening group area 82 is thus changeable as necessary in accordance with a mask design and/or a production method.

Although the present embodiment illustrates an example in which two mask opening group areas 82 are provided for one vapor deposition mask 80, the present embodiment is not limited to such an example. Each vapor deposition mask 80 only needs to have at least one mask opening group area 82, and therefore can have one mask opening group area 82 or can have three or more mask opening group areas 82.

In any of the cases above, the vapor deposition device 50 of the present embodiment is, unlike the case of Patent Literature 3, configured such that mask chips adjacent in the X axis direction are not combined in the X axis direction inside an opening that corresponds to a pattern of a vapor-deposited film to be formed. This makes it possible to form a highly-fine pattern of vapor-deposited films having a uniform film thickness, in the X axis direction.

FIG. 2 illustrates a case where the injection holes 61 of the vapor deposition source 60 are arranged two-dimensionally in a staggered manner. Note, however, that the present embodiment is not limited to such a case.

Figure 13:
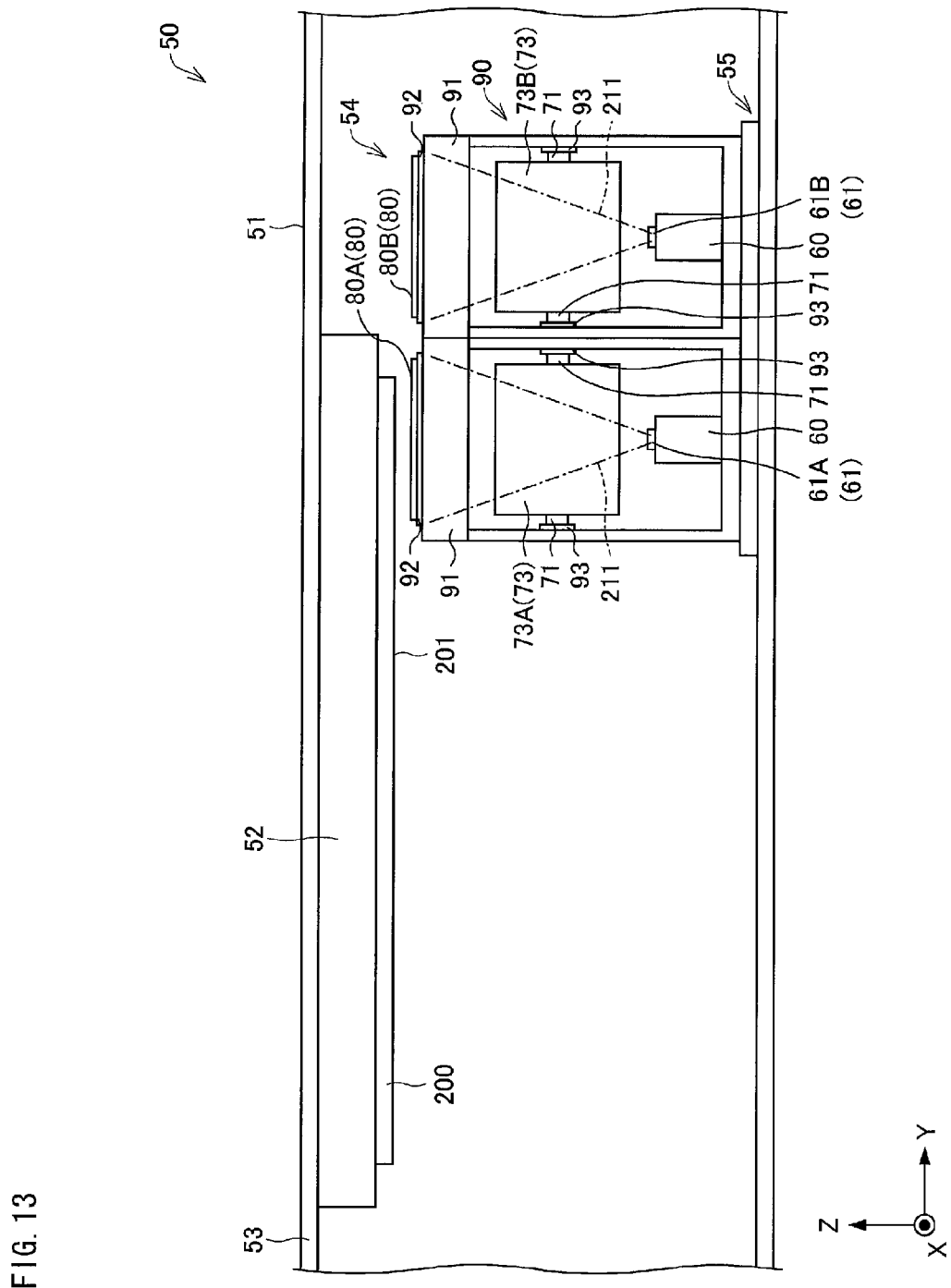
FIG. 13 is a cross-sectional view schematically illustrating another example of a configuration of main parts in the vapor deposition device, in accordance with Embodiment 1.

FIG. 13 is a cross-sectional view schematically illustrating another example of a configuration of main parts in the vapor deposition device 50, in accordance with the present embodiment.

The vapor deposition device 50 of the present embodiment (i) can include, instead of the vapor deposition source 60 illustrated in FIG. 2, two vapor deposition sources 60 each including injection holes 61 which are arranged one-dimensionally (i.e. in a linear manner) and (ii) can be configured such that, when viewed in a normal direction which is normal to principal surfaces of vapor deposition masks 80, the vapor deposition source 60 on an upstream side in a scanning direction and the vapor deposition source 60 on a downstream side in the scanning direction are out of alignment in an X axis direction so that the injection holes 61 of the vapor deposition source 60 on the upstream side and the injection holes 61 of the vapor deposition source 60 on the downstream side are arranged in a staggered manner (see, for example, FIG. 13).

In addition, FIG. 2 illustrates a case where the vapor deposition masks 80A on the upstream side in the scanning direction and the vapor deposition masks 80B on the downstream side in the scanning direction are held by one holder 90. Alternatively, as illustrated in FIG. 13, a vapor deposition mask 80A on the upstream side in the scanning direction and a vapor deposition mask 80B on the downstream side in the scanning direction can be held by respective holders 90.

The present embodiment has described the case where the vapor-deposited films 221 are formed in the pattern with the use of the vapor deposition device 50 as a device for producing the organic EL display device 1. Note, however, that the present embodiment is not limited to such a case. The vapor deposition device of the present embodiment can be applied to a wide range of use as a device for forming a vapor-deposited film pattern corresponding to sub-pixels of a display device.

Figure 14:
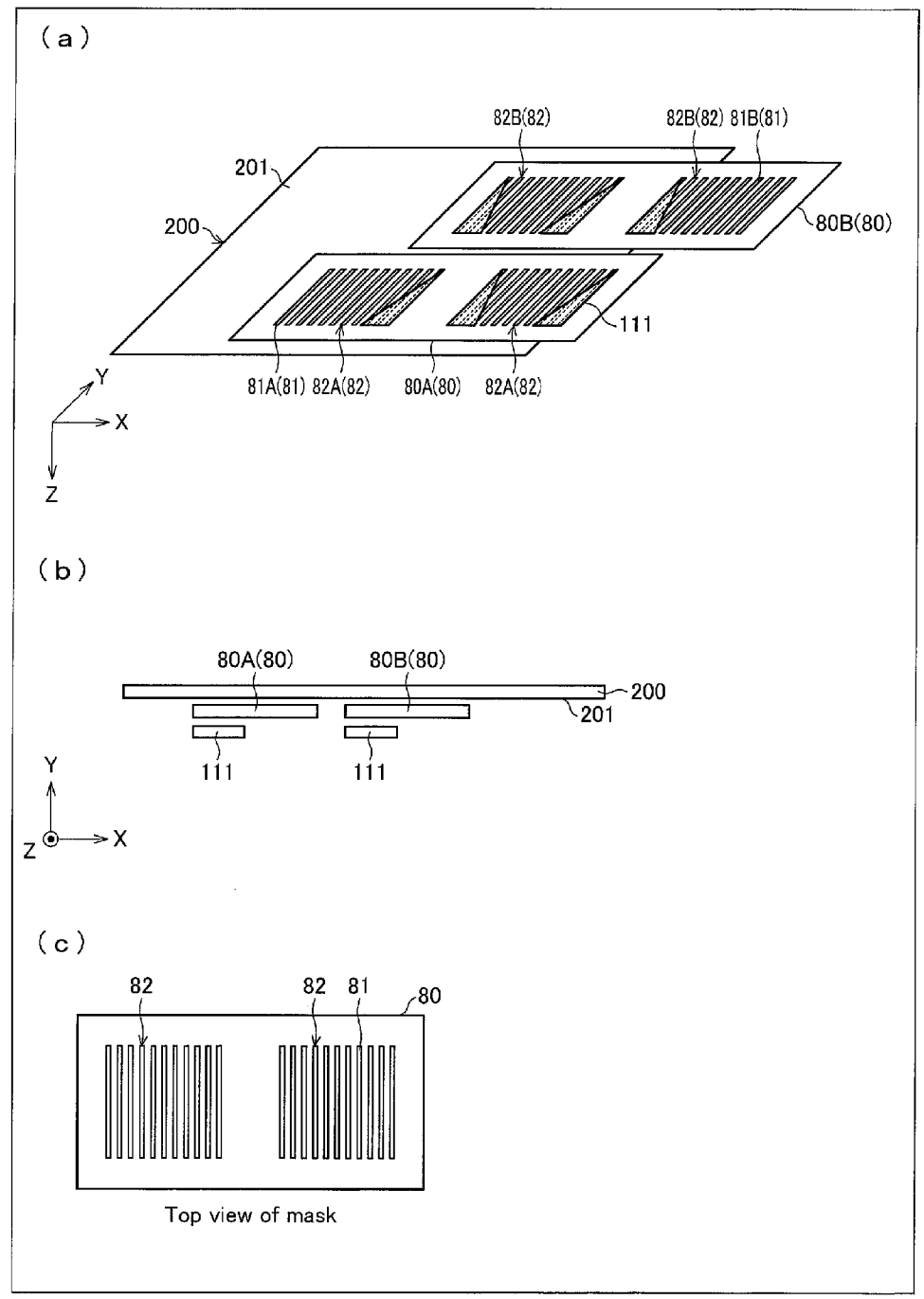
FIG. 14 is a view in which (a) is a perspective view schematically illustrating a configuration of main parts of a vapor deposition unit in accordance with Embodiment 2, when a film formation target substrate is viewed from a rear surface side of a vapor deposition mask in accordance with Embodiment 2, (b) is a lateral view schematically illustrating a configuration of the constituent elements of (a) of FIG. 14 which are laterally viewed, and (c) is a plan view schematically illustrating a configuration of the vapor deposition mask illustrated in (a) of FIG. 14.

The following description will discuss Embodiment 2 with reference to (a) through (c) of FIG. 14.

The present embodiment mainly describes differences from Embodiment 1. Note that members that have identical functions to those of Embodiment 1 are given identical reference numerals, and are not explained repeatedly.

(a) of FIG. 14 is a perspective view schematically illustrating a configuration of main parts of a vapor deposition unit 54 of the present embodiment when a film formation target substrate 200 is viewed from a rear surface side of vapor deposition masks 80. (b) of FIG. 14 is a lateral view schematically illustrating a configuration of the constituent elements of (a) of FIG. 14 which are laterally viewed. (c) of FIG. 14 is a plan view schematically illustrating a configuration of the vapor deposition masks 80 illustrated in (a) of FIG. 14.

Embodiment 1 has described a case where the mask openings 81 in each of the vapor deposition masks 80 have respective lengths which vary in the Y axis direction in accordance with locations of the mask openings 81 in the X axis direction.

Embodiment 2 is different from Embodiment 1 in that, as illustrated in (c) of FIG. 14, the mask openings 81 provided in each of the vapor deposition masks 80 have identical shapes, and that, as illustrated in (a) and (b) of FIG. 14, shielding plates 111, which partially cover overlapping areas 83 of mask opening group areas 82, are provided (i) directly under the vapor deposition masks 80 and (ii) for the respective mask opening group areas 82.

According to the present embodiment, the vapor deposition device 50 is thus configured such that the shielding plates 111 change opening lengths of vapor deposition masks 80 in the Y axis direction, when viewed in a normal direction which is normal to principal surfaces of the vapor deposition masks 80, by partially covering, in each of the vapor deposition masks 80, mask openings 81 in areas (i.e. overlapping areas 83) in which the mask opening group areas 82 overlap each other in the X axis direction when viewed along the Y axis direction.

Other than changing lengths themselves of the mask openings 81 actually provided on the vapor deposition masks 80 as is the case of Embodiment 1, substantial opening lengths of the vapor deposition masks 80 can be thus changed, in a manner similar to that of Embodiment 1, by use of the shielding plates 111 which are separately inserted.

In a case where the lengths themselves of the mask openings 81 actually provided on the vapor deposition masks 80 are changed as is the case of Embodiment 1, the shielding plates 111 are unnecessary. This allows a reduction in the number of members.

Meanwhile, according to Embodiment 2, it is possible to configure the mask openings 81 in the vapor deposition masks 80 to have identical shapes. This makes it possible, after production of vapor deposition masks 80, to easily change widths by which the mask opening group area 82A and the mask opening group area 82B overlap each other in the X axis direction when viewed along the Y axis direction (i.e. to easily change the widths in the X axis direction of the overlapping area 83). This allows for an increase in degree of freedom to which a layout of the vapor deposition masks 80 can be changed.

In a case where the shape of each of the mask openings 81 themselves in the vapor deposition masks 80 is changed, the mask openings 81 are formed all at once in one vapor deposition mask 80. This easily allows for accuracy. Meanwhile, in a case where a film thickness distribution is changed by processing conditions, material type change, time elapsing, or the like, the vapor deposition mask 80 needs to be made again. This sacrifices flexibility in terms of cost and delivery deadline. In contrast, in a case where the shielding plates 111 are used to adjust opening lengths of the mask openings 81 as is the case of Embodiment 2, flexibility is achieved by individually adjusting locations and shapes of the shielding plates 111 in accordance with various distribution properties of film thickness of vapor-deposited films 221.

The shielding plate 111 only needs to be made of, for example, aluminum, stainless or the like so as to have a reasonable degree of processing accuracy (e.g. ±0.1 mm). The shielding plate 111 is also smaller in size than the vapor deposition mask 80. This brings about a considerable advantage in terms of cost and delivery deadline.

Note that a size and a shape of the shielding plate 111 are not particularly limited, but only need to be set properly so that a shape of the mask opening group area 82 in the overlapping area 83 is similar to those of the mask opening group area 82 in the overlapping area 83 described in Embodiment 1.

A material for the shielding plate 111 is also not limited to any particularly one, provided that the shielding plate 111 can prevent vapor deposition particles 211 from passing through a mask opening 81 in an area in which the shielding plate 111 is provided. As long as the shielding plate 111 can be held so as not to be bent, the shielding plate 111 is preferably made of as light a material as possible and formed to be as thin as possible so that the shielding plate 111 is made light in weight.

Figure 15:
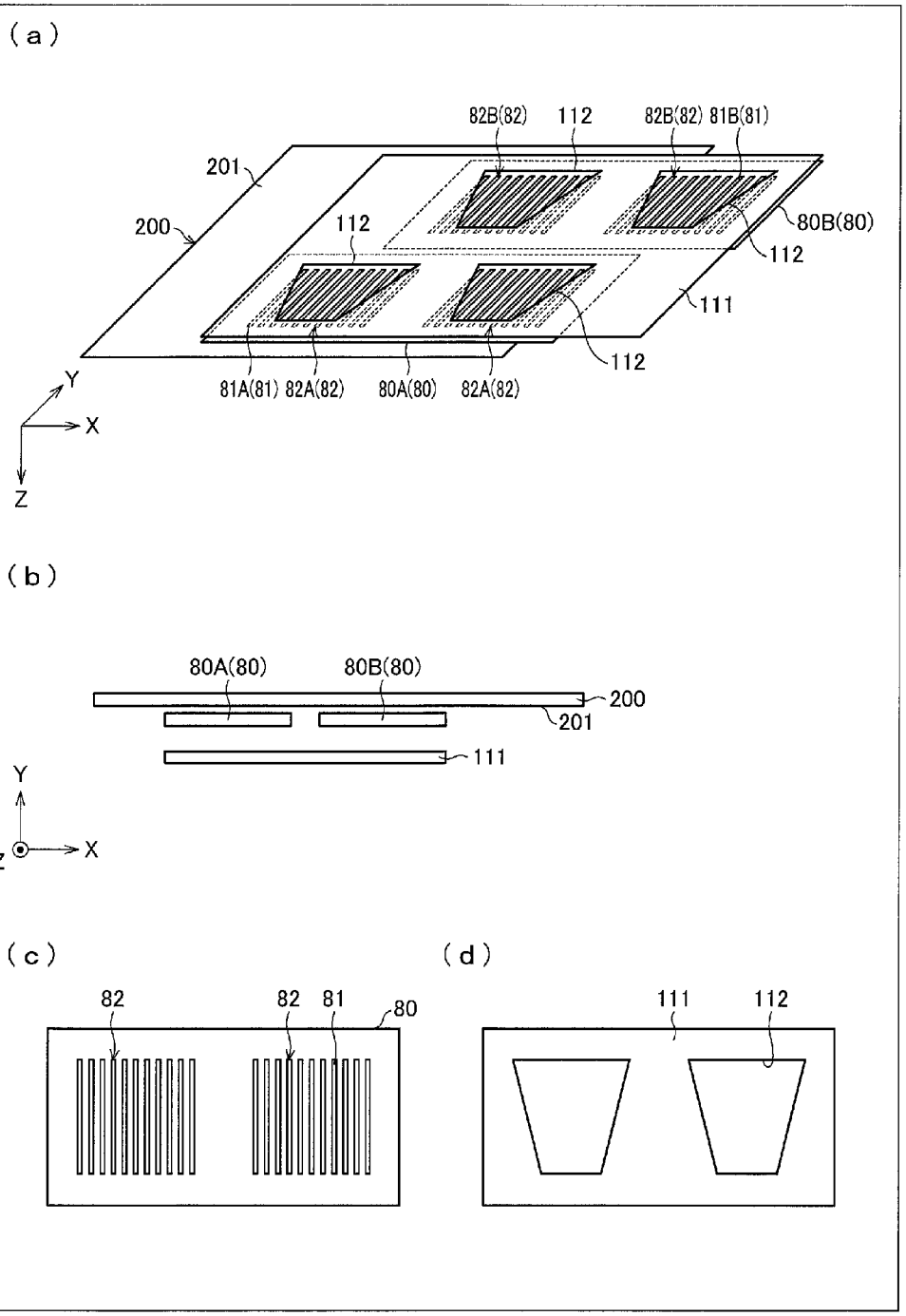
FIG. 15 is a view in which (a) is a perspective view schematically illustrating a configuration of main parts of a vapor deposition unit in accordance with Embodiment 3, when a film formation target substrate is viewed from a rear surface side of a vapor deposition mask in accordance with Embodiment 3, (b) is a lateral view schematically illustrating a configuration of the constituent elements of (a) of FIG. 15 which are laterally viewed, (c) is a plan view schematically illustrating a configuration of the vapor deposition mask illustrated in (a) of FIG. 15, and (d) is a plan view schematically illustrating a configuration of the shielding plate illustrated in (a) of FIG. 15.

The following description will discuss Embodiment 3 with reference to (a) through (d) of FIG. 15.

Embodiment 3 mainly describes differences from Embodiment 2. Note that members that have identical functions to those of Embodiments 1 and 2 are given identical reference numerals, and are not explained repeatedly.

(a) of FIG. 15 is a perspective view schematically illustrating a configuration of main parts of a vapor deposition unit 54 in accordance with Embodiment 3, when a film formation target substrate 200 is viewed from a rear surface side of vapor deposition masks 80. (b) of FIG. 15 is a lateral view schematically illustrating a configuration of the constituent elements of (a) of FIG. 15 which are laterally viewed. (c) of FIG. 15 is a plan view schematically illustrating a configuration of a vapor deposition mask 80 illustrated in (a) of FIG. 15. (d) of FIG. 15 is a plan view schematically illustrating a configuration of the shielding plate 111 illustrated in (a) of FIG. 15.

Embodiment 3 has described the case where the shielding plates 111 are provided, for the respective overlapping areas 83, on the mask opening group areas 82 in the vapor deposition masks 80. Therefore, two shielding plates 111 are provided for each of the mask opening group areas 82 in Embodiment 2.

The present embodiment will describe an example case where one (1) shielding plate 111 is provided across a plurality of mask opening group areas 82 by integrating the shielding plates 111 described in Embodiment 2.

According to the present embodiment, one (1) shielding plate 111 is provided directly under a plurality of vapor deposition masks 80 as illustrated in FIG. 15. The shielding plate 111 has opening areas 112 so that the mask opening group areas 82 are partially exposed through the opening areas 112.

Note that a shape of each of the opening areas 112 is to be properly configured such that a shape of a mask opening group area 82 in an overlapping area 83 is similar to those of the mask opening group areas 82 in the overlapping areas 83 as described in Embodiment 1.

According to the present embodiment also, it is possible to configure the mask openings 81 in the vapor deposition masks 80 to have identical shapes as with the case of Embodiment 2. This makes it possible, after production of vapor deposition masks 80, to easily change a width by which the mask opening group area 82A and the mask opening group area 82B overlap with each other in the X axis direction when viewed along the Y axis direction (i.e. to easily change the width in the X axis direction of the overlapping area 83). This allows for an increase in degree of freedom to which a layout of the vapor deposition masks 80 can be changed. According to the present embodiment, since the one (1) shielding plate 111 is provided across the plurality of mask opening group areas 82, it is possible to easily align the shielding plate 111 and the vapor deposition masks 80 with each other. According to the present embodiment, the plurality of opening areas 112 are formed all at once in the one (1) shielding plate 111. This easily allows for accuracy. Moreover, the opening areas 112 do not require highly-fine patterning as in the vapor deposition masks 80. This brings about an advantage in terms of cost and delivery deadline over a case where shapes of the mask openings 81 of the vapor deposition masks 80 (i.e. length in the Y axis direction) are changed in accordance with locations of the mask openings 81 in the X axis direction.

Figure 16:
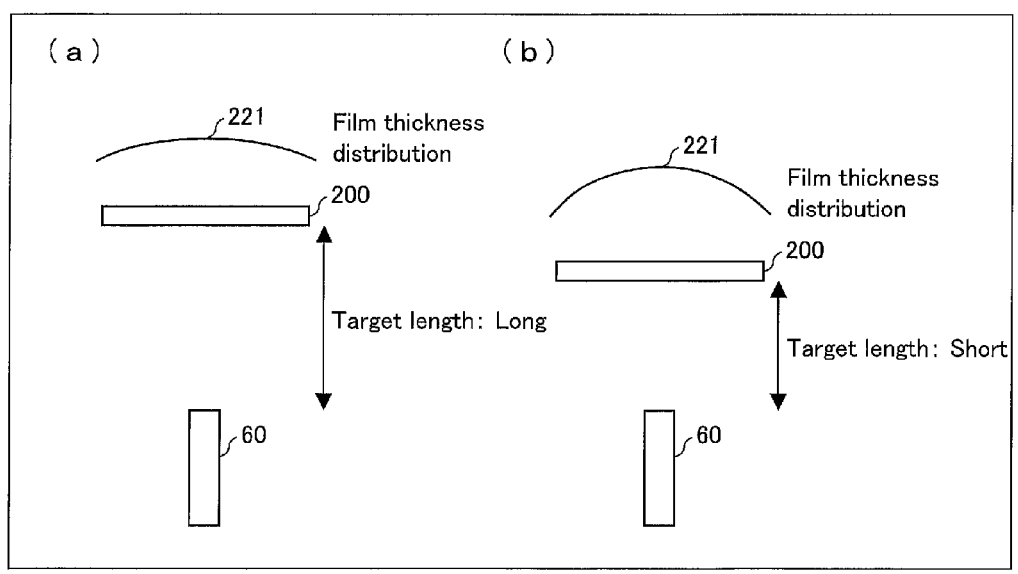
FIG. 16 is a view schematically illustrating a difference in film thickness distribution of a vapor-deposited film between cases where a distance between a vapor deposition source and a film formation target substrate is relatively long and relatively short. (a) of FIG. 16 illustrates a case where the distance between the vapor deposition source and the film formation target substrate is relatively long, and (b) of FIG. 16 illustrates a case where the distance between the vapor deposition source and the film formation target substrate is relatively short.
Figure 20:
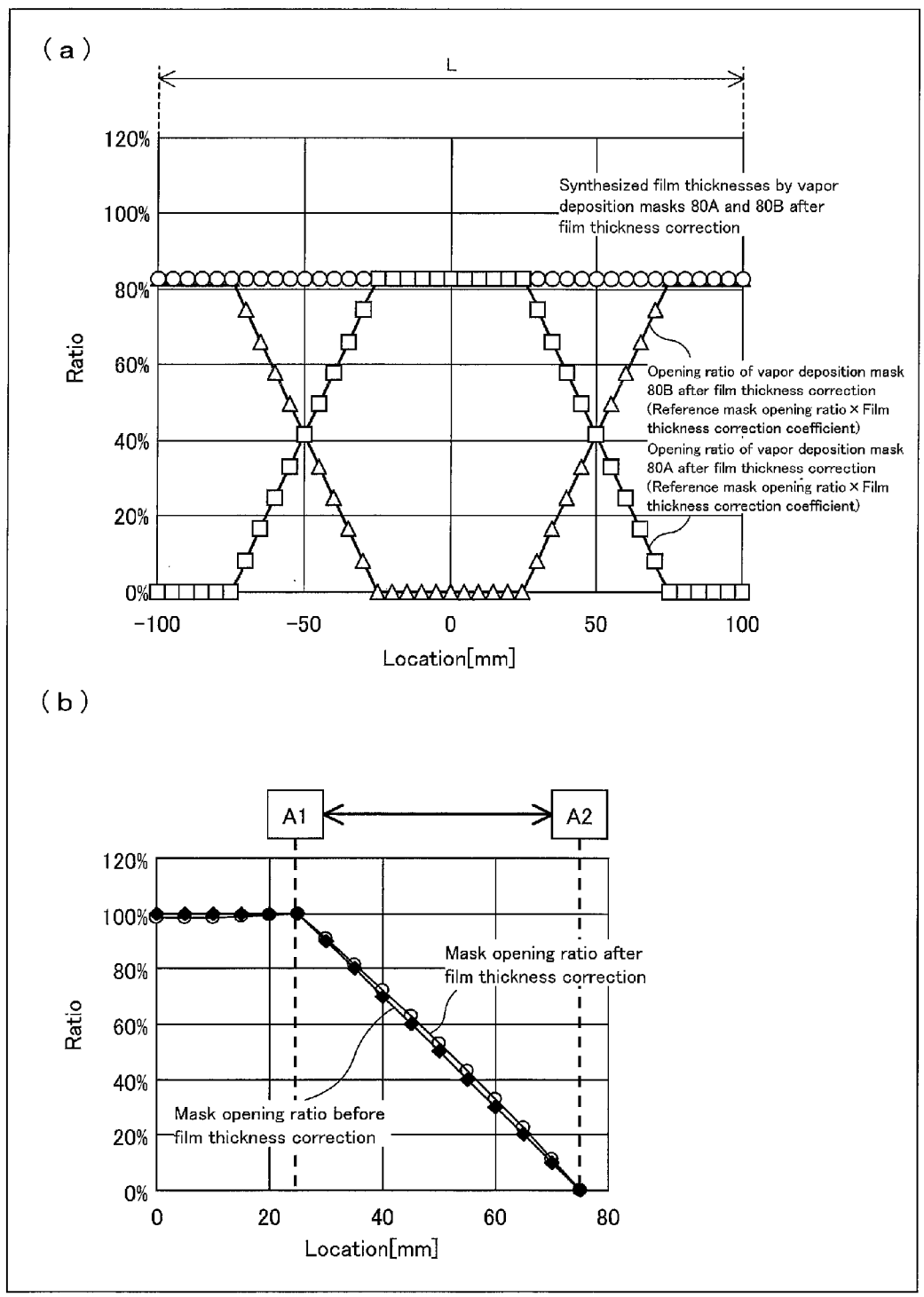
FIG. 20 is a view in which (a) is a graph illustrating a relation between (i) change in mask opening ratio of each of the vapor deposition masks by film thickness correction at locations in the X axis direction in the film formation section L of FIG. 5 and (ii) synthesized film thicknesses obtained by synthesizing the film thicknesses with use of vapor deposition masks arranged in the Y axis direction after the film thickness correction, and (b) is a graph illustrating change in mask opening ratio of main parts by the film thickness correction.

The following description will discuss the present embodiment mainly with reference to (a) and (b) of FIG. 16 through (a) and (b) of FIG. 20.

Note that, in the present embodiment, differences from Embodiments 1 through 3 are mainly described, and identical reference numerals are given to constituent elements having functions identical to those in Embodiments 1 through 3, and descriptions of such constituent elements are omitted here.

Each of (a) and (b) of FIG. 16 is a view schematically illustrating a difference in film thickness distribution of a vapor-deposited film 221 between cases where a distance (target length) between a vapor deposition source 60 and a film formation target substrate 200 is relatively long and relatively short. (a) of FIG. 16 illustrates a case where the target length is relatively long, and (b) of FIG. 16 illustrates a case where the target length is relatively short.

In a case where the target length is long, there are (i) a merit that good film thickness distribution is obtained and (ii) a demerit that a vapor deposition rate is low (see (a) of FIG. 16). Meanwhile, in a case where the target length is short, there are (i) merits that a vapor deposition rate is high and a tact is fast and (ii) a demerit that a film thickness distribution is wide as illustrated in (b) of FIG. 16. Therefore, it is preferable to properly use a vapor deposition mask 80 depending on the target length. In a case where the target length is long and the film thickness distribution is so small as to be ignorable, uniform vapor-deposited films can be formed with the pattern shape of the mask openings 81 in Embodiments 1 through 3. However, in a case where the target length is designed to be short in order to enhance the tact, the film thickness distribution becomes unignorable, and it is necessary to design a pattern shape of the mask openings 81 while taking into consideration the film thickness distribution.

Figure 17:
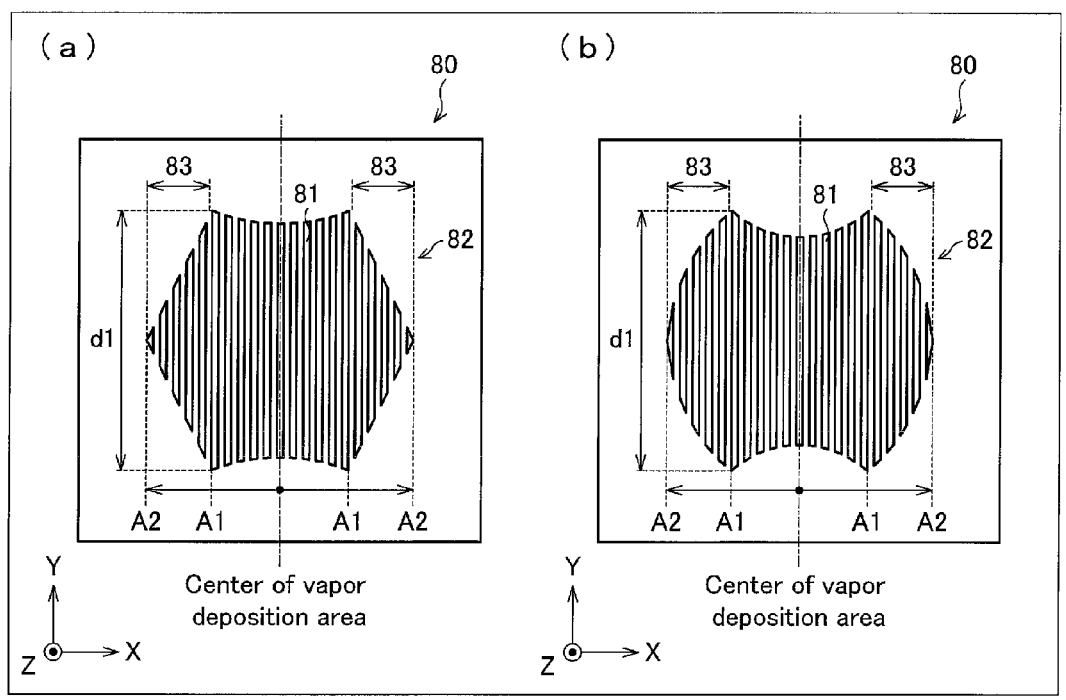
FIG. 17 is a plan view illustrating, in each of (a) and (b), an example of a pattern of openings of a mask opening group in a vapor deposition mask in Embodiment 4.

Each of (a) and (b) of FIG. 17 is a plan view illustrating an example of a pattern of openings of a mask opening group area 82 in a vapor deposition mask 80 in the present embodiment.

The vapor deposition mask 80 having the opening pattern illustrated in (a) of FIG. 17 is used in a case where the target length is relatively long and the film thickness distribution is unignorable as illustrated in (a) of FIG. 16. In a case where the target length is short as illustrated in (b) of FIG. 16, the vapor deposition mask 80 having the opening pattern illustrated in (b) of FIG. 17 is used.

As is clear from the film thickness distribution illustrated in (a) and (b) of FIG. 16, in vacuum vapor deposition, the injection hole 61 is located, in the X axis direction, at a center of each of the mask opening group areas 82, and therefore most of the vapor deposition particles 211 are injected to a part vertical to the injection hole 61 based on the cosine law, that is, injected to a center of each vapor deposition block 101 (vapor deposition space). From this, an amount of the injected vapor deposition particles 211 decreases as a distance to the limiting plate 73 becomes shorter.

Therefore, depending on a size of the mask opening group area 82, in other words, a size of the vapor deposition block 101 in the X axis direction, it is possible to form vapor-deposited films 221 which have identical thicknesses and are in a stripe pattern, by setting (i) the length of the mask opening 81 in the Y axis direction to be shortest at a location immediately above the injection hole 61 and (ii) the lengths of the mask openings 81 in the Y axis direction to become longer as a distance from the injection hole 61 in the X axis direction becomes greater.

Therefore, as illustrated in (a) and (b) of FIG. 17, it is preferable that the opening lengths of the vapor deposition masks 80 (in (a) and (b) of FIG. 17, equal to lengths of the mask openings 81 in the Y axis direction) become longer between a center of the vapor deposition source and A1 by reflecting the film thickness distribution, and the opening lengths of the vapor deposition masks 80 become shorter toward the outer side of the mask opening group area 82 between A1 and A2, as with Embodiments 1 through 3.

That is, it is preferable to set the opening lengths so that, when viewed in the normal direction which is normal to the principal surface of the vapor deposition mask 80, in each of the mask opening group areas 82, the mask openings 81 have, in the Y axis direction, opening lengths, which become longer as a distance in the X axis direction from above the injection hole 61 increases, in a non-overlapping area 84 that is on one straight line extending in the Y axis direction on which line no other mask openings 81 exist.

For example, opening lengths of the respective mask openings 81 illustrated in (a) and (b) of FIG. 17 can be calculated, as "mask opening length after film thickness correction" in a formula (1), with the use of a film thickness correction coefficient which is calculated from the film thickness distribution of the vapor-deposited films 221 in the mask opening group area 82.

Mask opening length after film thickness correction=reference mask opening length×film thickness correction coefficient (1)

Here, the film thickness correction coefficient is obtained as follows: That is, with the use of vapor deposition masks 80 having opening lengths which are uniform in the X axis direction as illustrated in (a) and (b) of FIG. 6, vapor deposition is carried out only in the row I, and film thicknesses of respective vapor-deposited films 221 corresponding to the respective mask openings 81 are measured. Thus, the film thicknesses of the respective vapor-deposited films 221 corresponding to the respective mask openings 81 arranged in the X axis direction and a smallest film thickness value (corresponding to an outermost mask opening 81 in the mask opening group area 82) are obtained, and the film thickness correction coefficient is calculated by a formula (2) below. Moreover, with regard to the row II, a film thickness correction coefficient is similarly calculated.

Film thickness correction coefficient=1/(film thickness of vapor-deposited film 221 corresponding to mask openings 81 arranged in $X$ axis direction/smallest film thickness value) (2)

Here, the mask opening length after film thickness correction indicates an opening length of each of the mask openings 81 which opening length has been corrected with the use of the film thickness distribution of the vapor-deposited films 221, as above described. The reference mask opening length is an opening length of the mask opening 81 which is obtained without taking into consideration the film thickness distribution as in Embodiments 1 through 3. Film thicknesses, which have been obtained through mask openings 81 whose opening lengths have not been corrected, have the film thickness distribution at locations in the X axis direction as illustrated in (a) or (b) of FIG. 16.

The following description will discuss a method for changing an opening length in the vapor deposition mask 80 illustrated in (a) and (b) of FIG. 17, with reference to an example of forming a film in a film formation section L illustrated in FIG. 5.

Figure 18:
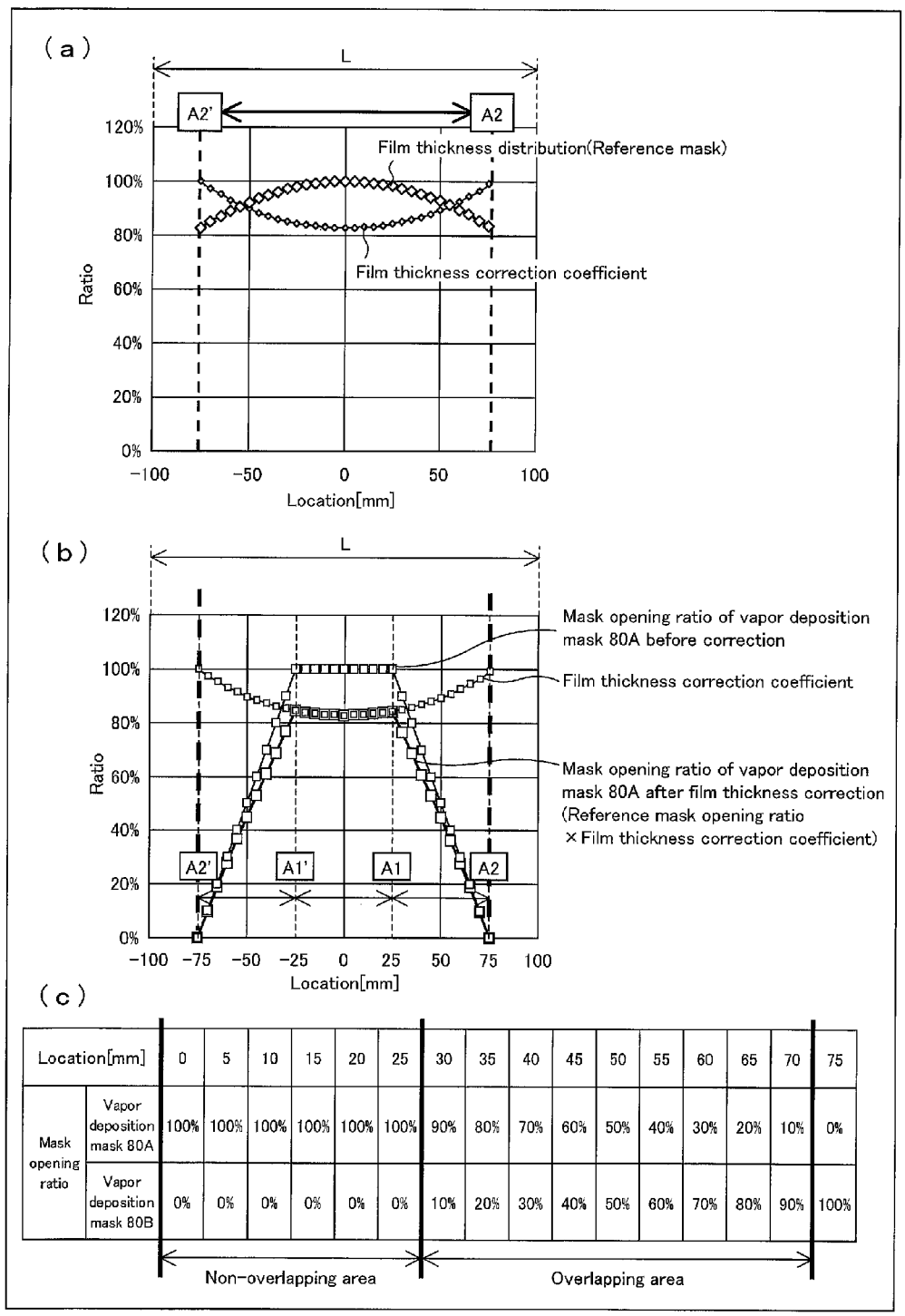
FIG. 18 is a view in which (a) is a graph illustrating a relation between a film thickness distribution of vapor-deposited films at locations in an X axis direction and film thickness correction coefficients in a film formation section L of FIG. 5 in a case where no vapor deposition mask is provided in the vapor deposition area in the row I, (b) is a graph illustrating a relation between (i) a change in mask opening ratio of the vapor deposition mask by film thickness correction and (ii) a film thickness correction coefficient in the film formation section L, and (c) is a table showing mask opening ratios, at locations in the X axis direction, of vapor deposition masks arranged in the Y axis direction before opening lengths are corrected.

(a) of FIG. 18 is a graph illustrating a relation between a film thickness distribution at locations in the X axis direction of the vapor-deposited films 221 and film thickness correction coefficients in the film formation section L in a case where a vapor deposition mask 80 is employed in which opening lengths are uniform in the X axis direction as illustrated in (a) and (b) of FIG. 6 in the row I in the vapor deposition area of the vapor deposition mask 80A. (b) of FIG. 18 is a graph illustrating a relation between (i) a change in mask opening ratio of the vapor deposition mask 80A (i.e., a ratio obtained when an opening length of a mask opening 81 in the non-overlapping area 84 before film thickness correction, that is, a reference mask opening length of the non-overlapping area 84 is assumed to be 100%) by film thickness correction and (ii) a film thickness correction coefficient in the film formation section L. (c) of FIG. 18 is a table showing mask opening ratios, at locations in the X axis direction, of the vapor deposition masks 80A and 80B before film thicknesses correction.

Figure 19:
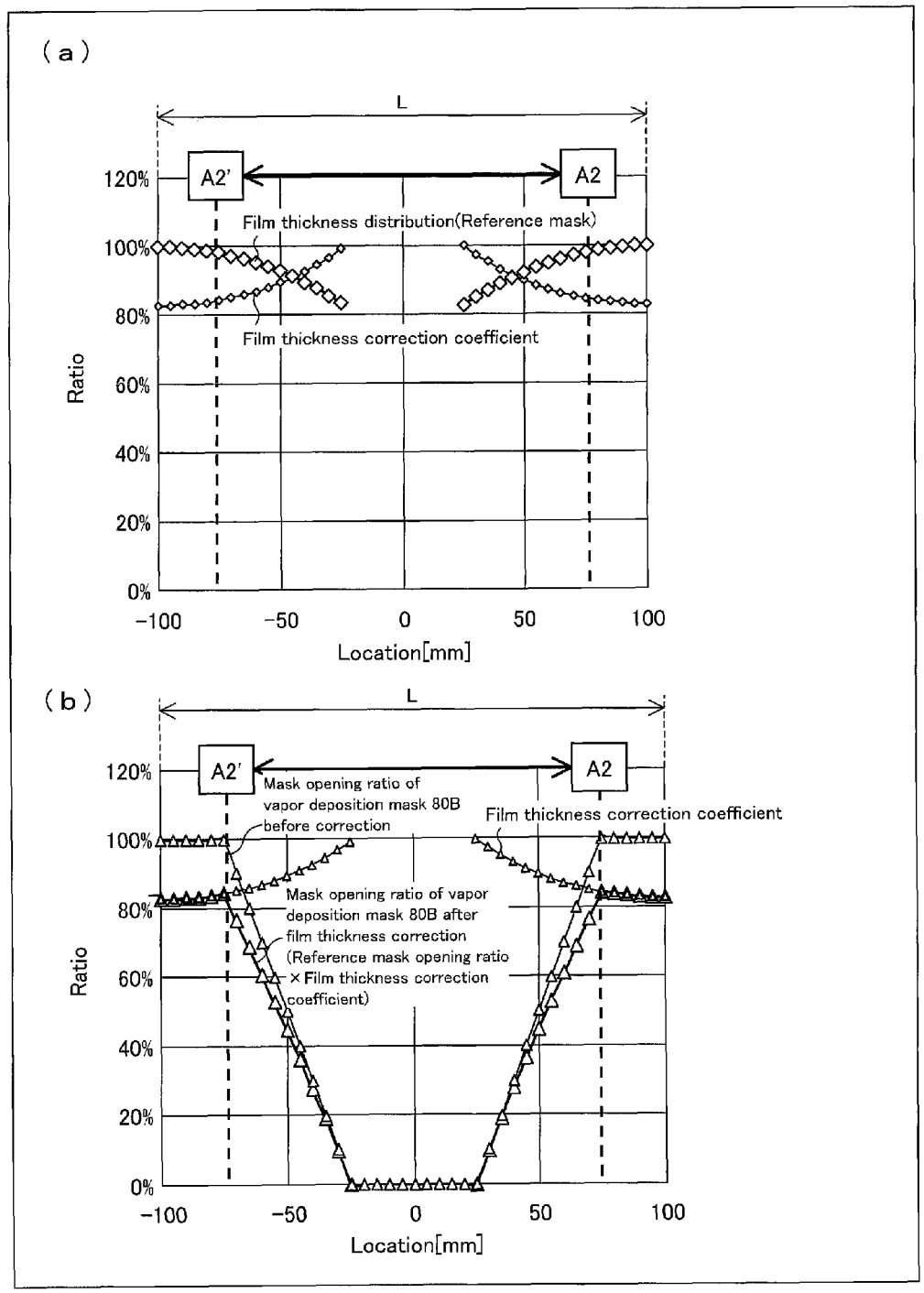
FIG. 19 is a view in which (a) is a graph illustrating a relation between a film thickness distribution of vapor-deposited films at locations in the X axis direction and film thickness correction coefficients in the film formation section L of FIG. 5 in a case where a vapor deposition mask having opening lengths which are uniform in the X axis direction is used in the vapor deposition area in the row II, and (b) is a graph illustrating a relation between (i) a change in mask opening ratio of the vapor deposition mask by film thickness correction and (ii) a film thickness correction coefficient in the film formation section L.

(a) of FIG. 19 is a graph illustrating a relation between a film thickness distribution of vapor-deposited films at locations in the X axis direction and film thickness correction coefficients in the film formation section L in a case where a vapor deposition mask 80 is employed in which opening lengths are uniform in the X axis direction as illustrated in (a) and (b) of FIG. 6 in the row II in the vapor deposition area of the vapor deposition mask 80B. (b) of FIG. 19 is a graph illustrating a relation between (i) a change in mask opening ratio of the vapor deposition mask 80B by film thickness correction and (ii) a film thickness correction coefficient in the film formation section L.

(a) of FIG. 20 is a graph illustrating a relation between (i) change in mask opening ratio of each of the vapor deposition masks 80A and 80B by film thickness correction at locations in the X axis direction in the film formation section L and (ii) film thicknesses of vapor-deposited films 21 formed with the use of the vapor deposition masks 80A and 80B after the film thickness correction (i.e., synthesized film thicknesses obtained by synthesizing the film thicknesses with use of vapor deposition masks 80A and 80B after the film thickness correction). (b) of FIG. 20 is a graph illustrating change in mask opening ratio of main parts by the film thickness correction.

Note that, in (a) and (b) of FIG. 18 through (a) and (b) of FIGS. 20, A2 and A2' indicate respective locations that correspond to both end parts in the X axis direction of the mask openings 81 of the vapor deposition mask 80A in the film formation section L illustrated in FIG. 5. Moreover, in (a) and (b) of FIG. 18 through (a) and (b) of FIG. 20, a location "0" indicates a center of the vapor deposition area in the X axis direction of the vapor deposition mask 80A in the film formation section L. Moreover, in FIGS. 18 through 20, the vertical axis indicates ratios relative to a reference value which ratios are obtained by scaling (normalizing) values described in (a) and (b) of FIG. 18 through (a) and (b) of FIG. 20. Specifically, with regard to the film thickness distribution and the synthesized film thicknesses, assuming that a largest film thickness in the film thickness distribution is 100%, ratios of the film thickness of the vapor-deposited films 221 at the locations in the X axis direction are indicated; with regard to the film thickness correction coefficients, ratios of the film thickness correction coefficient are indicated in a case where a maximum value of the film thickness correction coefficient is 100%; with regard to the opening ratio, ratios (mask opening ratios) of mask opening lengths in the vapor deposition masks 80A and 80B at the locations in the X axis direction, relative to the reference mask opening length of the non-overlapping area 84, are indicated.

The mask opening ratios of the vapor deposition masks 80A and 80B having the opening pattern illustrated in (b) of FIG. 17 after the film thickness correction (i.e., mask opening ratios of the vapor deposition masks 80A and 80B after the film thickness correction illustrated in (b) of FIG. 18, (b) of FIG. 19, and FIG. 20) can be calculated by a formula (3) below. Note that, in the formula (3) below, the mask opening ratio before the film thickness correction is an opening ratio of the reference mask opening length.

Mask opening ratio after film thickness correction=mask opening ratio before film thickness correction×film thickness correction coefficient (3)

As is clear from (b) of FIG. 17, (b) of FIG. 18, (b) of FIG. 19, and (b) of FIG. 20, according to the present embodiment, in a case where the film thickness distribution is wide, the opening length of each of the mask openings 81 is determined and/or changed based on the mask opening length after film thickness correction, and thus the mask opening group area 82 after the film thickness correction is to have a shape in which, in the overlapping area 83, a middle part of a line connecting apices of the mask opening group area 82 is slightly curved outwardly from a straight line connecting the apices.

Note that the film thickness of the vapor-deposited film 221 which has been formed with the mask opening length after film thickness correction is equal to the smallest film thickness value. In the example illustrated in (a) of FIG. 18, the film thickness after the correction is approximately 82% of the film thickness before the correction. A reason for thus correcting the film thickness to be smaller is because the mask opening length is first set to be longest from the viewpoint of enhancing efficiency of utilization of a vapor deposition material and the mask opening length is corrected to shorten the length. As such, the film thickness after the correction becomes smaller. However, the film thickness after the correction is adjusted to conform with the film thickness before the correction by, for example, increasing a vapor deposition temperature of the vapor deposition source 60 so as to increase the vapor deposition rate. The film thickness distribution is thus eliminated, and it is therefore possible to form vapor-deposited films that have a desired uniform film thickness.

As above described, according to the present embodiment, the mask opening length of each of the mask openings 81 after film thickness correction is calculated based on the film thickness of the vapor-deposited film 221 that is actually formed through each of the mask openings 81. It is therefore possible to form vapor-deposited films 221 having equal film thicknesses, regardless of the locations of the mask openings 81 in the X axis direction, as illustrated in (a) of FIG. 20.

From this, it is possible to form vapor-deposited films 221 which have identical thicknesses and are in a stripe pattern, by taking into consideration not only film thicknesses in one (1) vapor deposition block 101 but also overlapping of vapor-deposited films 221 due to mask openings 81 which are adjacent to each other in the Y axis direction in the vapor deposition block 101.

In the present embodiment, an example is described in which lengths of the mask openings 81 in the Y axis direction are changed in accordance with the locations of the mask openings 81 in the X axis direction, as in Embodiment 1. Note, however, that it is of course possible that the substantial opening lengths in the vapor deposition mask 80 are changed with the use of the shielding plates 111 as in Embodiments 2 and 3.

Moreover, in the present embodiment, an example is described in which the vapor deposition mask 80 having the opening pattern illustrated in (b) of FIG. 17 is employed as the vapor deposition mask 80 used when the target length is short. Note, however, that the present embodiment is not limited to this. For example, even in a case where the target length is short and the vapor deposition mask 80 having the opening pattern illustrated in (a) of FIG. 17 is used, it is possible to form vapor-deposited films 221 having uniform film thicknesses regardless of the locations of the mask openings 81 in the X axis direction by shielding a part in which a film thickness distribution is poor in the overlapping area 83 of the mask opening group area 82 with, for example, a limiting plate (controlling plate). Similarly, even in a case where the vapor deposition mask 80 having the opening pattern of Embodiments 1 through 3 is employed, it is possible to form vapor-deposited films 221 having uniform film thicknesses regardless of the locations of the mask openings 81 in the X axis direction by shielding a part in which a film thickness distribution is poor in the overlapping area 83 of the mask opening group area 82.

A vapor deposition device 50 in accordance with an aspect 1 of the present invention is a vapor deposition device for forming vapor-deposited films 221 on a film formation target substrate 200 for use in a display device (e.g., organic EL display device 1), the vapor-deposited films 221 being formed for respective sub-pixels (sub-pixels 2R, 2G, and 2B) of the display device in a predetermined pattern, the vapor deposition device 50 including: a vapor deposition unit 54 having a vapor deposition source 60 and a plurality of vapor deposition masks 80; and a moving device (substrate moving device 103 or vapor deposition unit moving device 104) for moving one of the vapor deposition unit 54 and the film formation target substrate 200 relatively to the other, a length of each of the plurality of vapor deposition masks 80 in a first direction (Y axis direction) being shorter than a length of a vapor deposition area of the film formation target substrate 200 in the first direction, and a length of each of the plurality of vapor deposition masks 80 in a second direction (X axis direction) being shorter than a length of the vapor deposition area in the second direction, the first direction being a moving direction (scanning direction) by the moving device, and the second direction being perpendicular to the first direction, the plurality of vapor deposition masks 80 including two or more vapor deposition masks arranged at least in the first direction, each of the plurality of vapor deposition masks 80 having one or more mask opening group areas 82 which are arranged in the second direction via a shielding area 85 corresponding to at least one pixel, each of the one or more mask opening group areas 82 (i) including a plurality of mask openings 81 which are arranged at least in the second direction and (ii) pairing up with an injection hole 61 of the vapor deposition source 60, vapor deposition particles 211 being injected from the injection hole 61, the two or more vapor deposition masks 80 adjacent to each other in the first direction being out of alignment in the second direction such that, (i) when viewed along the first direction, mask openings 81 in a first end part of each of the one or more mask opening group areas 82 of one of the two or more vapor deposition masks 80 overlap, in the second direction, with mask openings 81 in a second end part of each of the one or more mask opening group areas 82 of another one of the two or more vapor deposition masks 80 which is adjacent to the one of the two or more vapor deposition masks 80, the first end part and the second end part being respective two end parts of each of the one or more mask opening group areas 82 in the second direction, and (ii) a vapor-deposited film 221 formed via mask openings 81 in the first end part and in the second end part which are adjacent to each other in the first direction extends on one straight line in the first direction, a total length in the second direction of ones of the plurality of vapor deposition masks 80 being longer than the length of the vapor deposition area in the second direction, the mask openings 81 being provided for the respective sub-pixels, in each of the first end part and the second end part which overlap with each other in the second direction (overlapping area 83) when viewed along the first direction, the mask openings 81 being formed to have, in the first direction, opening lengths which become shorter toward an outer side of each of the one or more mask opening group areas 82 when viewed in a normal direction which is normal to a principal surface of each of the plurality of vapor deposition masks 80.

Note that each of the opening lengths "in the first direction . . . when viewed in a normal direction which is normal to a principal surface of each of the plurality of vapor deposition masks 80" is not a length of the mask opening 81 itself of each of the plurality of vapor deposition masks 80 but is a substantial length of an actual opening in the vapor deposition mask 80 in the first direction when viewed in the normal direction (i.e., a length, in the first direction, of an opening area through which vapor deposition particles 211 can pass). That is, in a case where a mask opening 81 of a vapor deposition mask 80 is partially closed by, for example, a shielding plate 111 when viewed in the normal direction, "the opening length in the first direction when viewed in the normal direction" indicates a length of a mask opening 81, which is actually open, in the first direction when viewed in the normal direction (i.e., a length, in the first direction, of a mask opening 81 that is not closed by the shielding plate 111).

According to the configuration, it is possible to carry out scanning vapor deposition with the use of the vapor deposition mask 80 that is smaller than a conventional one, by dividing a mask opening 81 which corresponds to each of sub-pixels in the second direction of the film formation target substrate 200. This makes it possible to reduce a weight of the vapor deposition mask 80 as compared with a conventional one, and it is possible to inhibit positional displacement in vapor deposition caused due to deflection of the vapor deposition mask 80. It is therefore possible to inhibit blurred vapor deposition which is caused due to deflection of the vapor deposition mask 80.

Moreover, according to the configuration, the vapor deposition masks 80A and 80B adjacent to each other in the first direction are arranged so as to be out of alignment in the second direction and, in the overlapping area 83 in which mask opening group areas 82 in the vapor deposition masks 80 overlap with each other in the second direction when viewed along the first direction, the mask openings are formed to have, in the first direction, opening lengths which become shorter toward an outer side of each of the one or more mask opening group areas 82 when viewed in the normal direction. This makes it possible to gradually change opening lengths in a boundary section between mask opening group areas 82 in respective vapor deposition masks 80 adjacent to each other in the first direction. The boundary section is a mask relaying section at which any two of the plurality of vapor deposition masks 80 are connected to each other.

From this, even in a case where scanning vapor deposition is carried out with the use of the vapor deposition mask 80 that is smaller than a conventional one by dividing a mask opening 81 which corresponds to each of sub-pixels in the second direction of the film formation target substrate 200 as above described, it is possible to carry out uniform vapor deposition without block separation in the boundary section between the mask opening group areas.

Moreover, according to the configuration, the vapor deposition masks 80 are not connected in the X axis direction within a sub-pixel, and it is therefore easy to control patterning.

Moreover, according to the configuration, each of the mask opening group areas 82 pairs up with the injection hole 61 of the vapor deposition source 60, and this makes it possible to determine a source (injection hole 61) from which the vapor deposition particles 211 come to each of the mask openings 81. It is therefore possible to set a location of the mask opening 81 which location is optimal to an incoming angle of the vapor deposition particles 211. This allows (i) prevention of blurred vapor deposition and (ii) improvement in vapor deposition efficiency.

In the boundary section between the mask opening group areas 82 which are adjacent to each other in the second direction, vapor deposition particles 211 which have come from two injection holes 61 corresponding to the respective mask opening group areas 82 tend to be mixed. However, as above described, the mask opening group areas 82 which are adjacent to each other in the second direction are provided via the shielding area 85 for at least one pixel, and this makes it possible to prevent blurred vapor deposition, in particular, blurred vapor deposition in the boundary section between the mask opening group areas which are adjacent to each other in the second direction.

Moreover, according to an aspect of the present invention, each of the mask opening group areas pairs up with the injection hole of the vapor deposition source, and this makes it possible to determine a source (injection hole) from which the vapor deposition particles come to each of the mask openings. It is therefore possible to set a location of the mask opening which location is optimal to an incoming angle of the vapor deposition particles. This allows (i) prevention of blurred vapor deposition and (ii) improvement in vapor deposition efficiency.

In the boundary section between the mask opening group areas which are adjacent to each other in the second direction, vapor deposition particles which have come from two injection holes corresponding to the respective mask opening group areas tend to be mixed. However, as above described, the mask opening group areas which are adjacent to each other in the second direction are provided via the shielding area for at least one pixel, and this makes it possible to prevent blurred vapor deposition, in particular, blurred vapor deposition in the boundary section between the mask opening group areas which are adjacent to each other in the second direction.

According to the vapor deposition device 50 in accordance with an aspect 2 of the present invention, it is preferable in the aspect 1 that the plurality of vapor deposition masks 80 include (i) two or more vapor deposition masks arranged in the first direction and (ii) another two or more vapor deposition masks arranged in the second direction.

This makes it possible to reduce a size of each of the plurality of vapor deposition masks 80.

According to the vapor deposition device 50 in accordance with an aspect 3 of the present invention, it is preferable in the aspect 1 or 2 that the two or more vapor deposition masks 80 adjacently arranged in the first direction are arranged such that the first end part of the each of one or more mask opening group areas 82 of each of the two or more vapor deposition masks 80 overlaps with the second end part of another one or more mask opening group areas 82 of another one of the two or more vapor deposition masks 80 in the second direction by one (1) pixel or more.

According to the configuration, it is possible to (i) surely prevent block separation in the boundary section and (ii) carry out vapor deposition more uniformly.

According to the vapor deposition device 50 in accordance with an aspect 4 of the present invention, it is preferable in any of the aspects 1 through 3 that, when viewed in the normal direction, in each of the first end part and the second end part which overlap with each other in the second direction when viewed along the first direction (overlapping area 83), a total opening length, in the first direction, of mask openings 81 which correspond to one sub-pixel is identical with each of total opening lengths corresponding to respective of the other sub-pixels.

According to the vapor deposition device 50 in accordance with an aspect 5 of the present invention, it is preferable in the aspects 1 through 4 that, when viewed in the normal direction, in any locations, a total opening length, in the first direction, of one or more mask openings 81 which correspond to each sub-pixel is identical with each of total opening lengths corresponding to respective of the other sub-pixels.

According to the configurations of the aspects 5 and 6, it is possible to carry out uniform vapor deposition without variation in amount of vapor deposition between mask openings 81 which are adjacent to each other in the second direction (X axis direction). It is therefore possible to form a highly-fine pattern of vapor-deposited films having a uniform film thickness.

According to the vapor deposition device 50 in accordance with an aspect 6 of the present invention, it is preferable in any of the aspects 1 through 4 that, when viewed in the normal direction, in each of the mask opening group areas 82, mask openings 81 have, in the first direction, opening lengths, which become longer as a distance in the second direction from above the injection hole 61 increases, in a region that is on one straight line extending in the first direction on which line no other mask openings 81 exist.

In vacuum vapor deposition, most of the vapor deposition particles 211 are injected to a part vertical to the injection hole 61 based on the cosine law, that is, injected to a center of each vapor deposition block 101 (vapor deposition space). From this, an amount of the injected vapor deposition particles 211 decreases as a distance to the limiting plate 73 becomes shorter.

Therefore, depending on a size of the mask opening group area 82, in other words, a size of the vapor deposition block 101 in the X axis direction, it is possible to form vapor-deposited films 221 which have identical thicknesses and are in a stripe pattern, by setting (i) the length of the mask opening 81 in the Y axis direction to be shortest at a location immediately above the injection hole 61 and (ii) the lengths of the mask openings 81 in the Y axis direction to become longer as a distance from the injection hole 61 in the X axis direction becomes greater.

Therefore, as above described, it is preferable that, when viewed in the normal direction, in each of the mask opening group areas 82, mask openings 81 have opening lengths, which become longer as a distance in the second direction from above the injection hole 61 increases, in a region that is on one straight line extending in the first direction on which line no other mask openings 81 exist.

According to the vapor deposition device 50 in accordance with an aspect 7 of the present invention, it is preferable in the aspect 6 that, when viewed in the normal direction, a total opening length (mask opening length after film thickness correction), in the first direction, of one or more mask openings 81 which are arranged in the first direction and correspond to each sub-pixel satisfies the following formulae: the total opening length (mask opening length after film thickness correction) in the first direction=reference mask opening length×film thickness correction coefficient, film thickness correction coefficient=1/(film thickness of vapor-deposited film 221 corresponding to mask openings 81 arranged in the second direction/smallest film thickness value) where the "reference mask opening length" is uniform opening lengths in the first direction of the plurality of vapor deposition masks 80 before changing the opening lengths.

According to the configuration, it is possible to form the vapor-deposited film 221 having equal film thicknesses, regardless of locations of the mask openings 81 in the second direction.

According to the vapor deposition device 50 in accordance with an aspect 8 of the present invention, it is preferable in the aspect 6 that, when viewed in the normal direction, a mask opening ratio, in the first direction, of one or more mask openings 81 which are arranged in the first direction and correspond to each sub-pixel satisfies the following formulae: the mask opening ratio in first direction=opening ratio of reference mask opening length×film thickness correction coefficient, film thickness correction coefficient=1/(film thickness of vapor-deposited film 221 corresponding mask openings 81 arranged in the second direction/smallest film thickness value) where the "reference mask opening length" is uniform opening lengths in the first direction of the plurality of vapor deposition masks 80 before changing the opening lengths, and the "opening ratio of reference mask opening length" is 100%.

According to the configuration, it is possible to form the vapor-deposited films 221 which have identical thicknesses and are in a stripe pattern, while taking into consideration overlapping of vapor-deposited films 221 by the mask openings 81 of the vapor deposition masks 80 which are adjacent to each other in the first direction.

According to the vapor deposition device 50 in accordance with an aspect 9 of the present invention, it is preferable in any of the aspects 1 through 8 that the mask openings 81 in each of the plurality of vapor deposition masks 80 have respective lengths which vary in the first direction in accordance with respective locations of the mask openings 81 in the second direction.

According to the configuration, the lengths of the mask openings 81 themselves are changed which are actually formed in the vapor deposition mask 80, and it is therefore possible to reduce the number of constituent members. Moreover, in a case where the shapes of the mask openings 81 themselves in the vapor deposition mask 80 are thus changed, the mask openings 81 are collectively formed in one (1) vapor deposition mask 80. It is therefore possible to advantageously secure accuracy with ease.

According to the vapor deposition device 50 in accordance with an aspect 10 of the present invention, it is preferable in any of the aspects 1 through 8 that the mask openings 81 provided in each of the plurality of vapor deposition masks have identical shapes; and the vapor deposition unit 54 has a shielding plate 111 for partially covering mask openings 81 each of which is located on one straight line extending in the first direction, on which one straight line a mask opening 81 of another one of the plurality of vapor deposition masks 80 is provided, so as to change opening lengths in the first direction of the mask openings 81 thus covered, when viewed in the normal direction.

According to the vapor deposition device 50 in accordance with an aspect 11 of the present invention, it is preferable in the aspect 10 that the shielding plate 111 is provided for each of the mask opening group areas 82 of each of the plurality of vapor deposition masks 80.

According to the vapor deposition device 50 in accordance with an aspect 12 of the present invention, it is preferable in the aspect 10 that the shielding plate 111 has an opening area 112 through which each of the mask opening group areas 82 is partially exposed; and the shielding plate 111 is provided so as to be shared by at least two of the mask opening group areas 82.

According to the configurations of the aspects 8 through 10, the mask openings 81 can have the identical shapes, and it is possible to easily change a width in the second direction by which width the mask opening group areas 82 in the vapor deposition masks 80 adjacent to each other in the Y axis direction overlap with each other when viewed along the first direction (i.e., a width of the overlapping area 83 in the X axis direction), after producing the vapor deposition masks 80. Therefore, it is possible to enhance a degree of freedom in layout of the vapor deposition masks 80.

In a case where the shape of each of the mask openings 81 themselves in the vapor deposition masks 80 is changed, the mask openings 81 are formed all at once in one vapor deposition mask 80. This easily allows for accuracy. Meanwhile, in a case where a film thickness distribution is changed by processing conditions, material type change, time elapsing, or the like, the vapor deposition mask 80 needs to be made again. This sacrifices flexibility in terms of cost and delivery deadline. In contrast, in a case where the shielding plates 111 are used to adjust opening lengths of the mask openings 81 as above described, flexibility is achieved by individually adjusting locations and shapes of the shielding plates 111 in accordance with various distribution properties of film thickness of vapor-deposited films 221. Moreover, the shielding plate 111 only needs to be made of, for example, aluminum, stainless or the like so as to have a reasonable degree of processing accuracy. The shielding plate 111 is also smaller in size than the vapor deposition mask 80. This brings about a considerable advantage in terms of cost and delivery deadline.

According to the aspect 10, since the one (1) shielding plate 111 is provided across the plurality of mask opening group areas 82, it is possible to further bring about an effect of easily aligning the shielding plate 111 and the vapor deposition masks 80 with each other, in addition to the above effect. Moreover, according to the aspect 10, the plurality of opening areas 112 are formed all at once in the one (1) shielding plate 111. This easily allows for accuracy. Moreover, the opening areas 112 do not require a highly-fine patterning as in the vapor deposition masks 80. This brings about an advantage in terms of cost and delivery deadline over a case where shapes of the mask openings 81 of the vapor deposition masks 80 (i.e. length in the first direction) are changed in accordance with locations of the mask openings 81 in the second direction.

The vapor deposition method in accordance with an aspect 13 of the present invention is a method for forming vapor-deposited films 221 on a film formation target substrate 200 for use in a display device (e.g., organic EL display device 1), the vapor-deposited films 221 being formed for respective sub-pixels (sub-pixels 2R, 2G, and 2B) of the display device in a predetermined pattern, the method including the steps of: moving one of a vapor deposition unit 54 and the film formation target substrate 200 relatively to the other in a first direction (scanning direction); and using the vapor deposition unit 54 having a vapor deposition source 60 and a plurality of vapor deposition masks 80, (a) a length of each of the plurality of vapor deposition masks 80 in the first direction (Y axis direction) being shorter than a length of a vapor deposition area of the film formation target substrate 200 in the first direction, and a length of each of the plurality of vapor deposition masks 80 in a second direction (X axis direction) being shorter than a length of the vapor deposition area in the second direction, the second direction being perpendicular to the first direction, (b) the plurality of vapor deposition masks 80 including two or more vapor deposition masks 80 arranged at least in the first direction, (c) each of the plurality of vapor deposition masks 80 having one or more mask opening group areas 82 which are arranged in the second direction via a shielding area 85 corresponding to at least one pixel, (d) each of the one or more mask opening group areas 82 (i) including a plurality of mask openings 81 which are arranged at least in the second direction and (ii) pairing up with an injection hole 61 of the vapor deposition source 60, vapor deposition particles 211 being injected from the injection hole 61, (e) the two or more vapor deposition masks 80 adjacent to each other in the first direction being out of alignment in the second direction such that, (i) when viewed along the first direction, mask openings 81 in a first end part of each of the one or more mask opening group areas 82 of one of the two or more vapor deposition masks overlap, in the second direction, with mask openings 81 in a second end part of each of the one or more mask opening group areas 82 of another one of the two or more vapor deposition masks 80 which is adjacent to the one of the two or more vapor deposition masks 80, the first end part and the second end part being respective two end parts of each of the one or more mask opening group areas 82 in the second direction, and (ii) a vapor-deposited film 221 formed via mask openings 81 in the first end part and in the second end part which are adjacent to each other in the first direction extends on one straight line in the first direction, (f) a total length in the second direction of ones of the plurality of vapor deposition masks 80 being longer than the length of the vapor deposition area in the second direction, (g) in each of the first end part and the second end part which overlap with each other in the second direction when viewed along the first direction (overlapping area 83), the mask openings being formed to have, in the first direction, opening lengths which become shorter toward an outer side of each of the one or more mask opening group areas 82 when viewed in a normal direction which is normal to a principal surface of each of the plurality of vapor deposition masks 80.

Note that the each of the opening lengths "in the first direction . . . when viewed in a normal direction which is normal to a principal surface of each of the plurality of vapor deposition masks 80" in the aspect 13 is identical with that of the aspect 1. According to the aspect 13, it is possible to bring about an effect similar to that of the aspect 1.

The present invention is not limited to the embodiments, but can be altered by a skilled person in the art within the scope of the claims. An embodiment derived from a proper combination of technical means disclosed in respective different embodiments is also encompassed in the technical scope of the present invention. Further, a new technical feature can be formed by combining technical means disclosed in the embodiments.

The present invention is suitably applicable to a vapor deposition device and a vapor deposition method each of which is used in scanning vapor deposition that employs a scanning method in which vapor deposition is carried out while relatively moving a film formation target substrate and a vapor deposition unit for scanning. In particular, the vapor deposition device of the present invention can be suitably used in a device and a method for producing an organic EL display device for, for example, a film formation process such as selective application of organic layers in the organic EL display device. The vapor deposition method of the present invention can be suitably used in a film formation process such as selective application of organic layers in an organic EL display device.

REFERENCE SIGNS LIST

1: Organic EL display device (display device)
2: Pixel
2R, 2G, 2B: Sub-pixel
10: TFT substrate
11: Insulating substrate
12: TFT
13: Interlayer film
13a: Contact hole
14: Wire
15: Edge cover
15R, 15G, 15B: Opening
20: Organic EL element
21: First electrode
22: Hole injection layer/hole transfer layer
23R, 23G, 23B: Luminescent layer
24: Electron transfer layer
25: Electron injection layer
26: Second electrode
30: Adhesive layer
40: Sealing substrate
50: Vapor deposition device
51: Vacuum chamber
52: Substrate holder
53: Substrate moving device
54: Vapor deposition unit
55: Vapor deposition unit moving device (moving device)
60, 60A, 60B: Vapor deposition source
61, 61A, 61B: Injection hole
70: Limiting plate unit
71: Supporting section
72, 72A, 72B: Limiting plate row
73, 73A, 73B: Limiting plate
74, 74A, 74B: Limiting plate opening
75: Limiting plate
80, 80A, 80B: Vapor deposition mask
81, 81A, 81B: Mask opening
82, 82A, 82B: Mask opening group area
83: Overlapping area
84: Non-overlapping area
85: Shielding area
90: Holder
91: Mask holder
91a: Opening
92: Mask tray
92a: Opening
93: Supporting member
101: Vapor deposition block
111: Shielding plate
112: Opening area
200: Film formation target substrate
201: Vapor deposition target surface
211: Vapor deposition particle
221, 221A, 221B: Vapor-deposited film

The invention claimed is:
1. A vapor deposition device for forming vapor-deposited films on a film formation target substrate for use in a display device, the vapor-deposited films being formed for respective sub-pixels of the display device in a predetermined pattern, said vapor deposition device comprising:
a vapor deposition unit having a vapor deposition source and a plurality of vapor deposition masks; and
a moving device for moving one of the vapor deposition unit and the film formation target substrate relatively to the other,
a length of each of the plurality of vapor deposition masks in a first direction being shorter than a length of a vapor deposition area of the film formation target substrate in the first direction, and a length of each of the plurality of vapor deposition masks in a second direction being shorter than a length of the vapor deposition area in the second direction, the first direction being a moving direction by the moving device, and the second direction being perpendicular to the first direction,
the plurality of vapor deposition masks are arranged so that two or more of the plurality of vapor deposition masks are arranged in the first direction and at least one of the plurality of vapor deposition masks is arranged in the second direction,
each of the plurality of vapor deposition masks having one or more mask opening group areas which are arranged in the second direction via a shielding area corresponding to at least one pixel,
each of the one or more mask opening group areas (i) including a plurality of mask openings which are arranged at least in the second direction and (ii) pairing up with an injection hole of the vapor deposition source, vapor deposition particles being injected from the injection hole,
the two or more vapor deposition masks adjacent to each other in the first direction being out of alignment in the second direction such that, (i) when viewed along the first direction, mask openings in a first end part of each of one or more mask opening group areas of one of the two or more vapor deposition masks overlap, in the second direction, with mask openings in a second end part of each of one or more mask opening group areas of another one of the two or more vapor deposition masks which is adjacent to the one of the two or more vapor deposition masks, the first end part and the second end part being respective two end parts of each of one or more mask opening group areas in the second direction, and (ii) a vapor-deposited film formed via mask openings in the first end part and in the second end part which are adjacent to each other in the first direction extends on one straight line in the first direction,
a total length of the at least one of the plurality of vapor deposition masks arranged in the second direction being longer than the length of the vapor deposition area in the second direction,
the mask openings being provided for the respective sub-pixels,
in each of the first end part and the second end part which overlap with each other in the second direction when viewed along the first direction, the mask openings being formed to have, in the first direction, opening lengths which become shorter toward an outer side of the each of one or more mask opening group areas when viewed in a normal direction which is normal to a principal surface of each of the plurality of vapor deposition masks.

2. The vapor deposition device as set forth in claim 1, wherein:
the plurality of vapor deposition masks include (i) two or more vapor deposition masks arranged in the first direction and (ii) another two or more vapor deposition masks arranged in the second direction.

3. The vapor deposition device as set forth in claim 1, wherein:
the two or more vapor deposition masks adjacently arranged in the first direction are arranged such that the first end part of the each of one or more mask opening group areas of each of the two or more vapor deposition masks overlaps with the second end part of another one or more mask opening group areas of another one of the two or more vapor deposition masks in the second direction by one (1) pixel or more.

4. The vapor deposition device as set forth in claim 1, wherein:
when viewed in the normal direction, in each of the first end part and the second end part which overlap with each other in the second direction when viewed along the first direction, a total opening length, in the first direction, of mask openings which correspond to one sub-pixel is identical with each of total opening lengths corresponding to respective of the other sub-pixels.

5. The vapor deposition device as set forth in claim 1, wherein:
when viewed in the normal direction, in any locations in the second direction, a total opening length, in the first direction, of one or more mask openings which correspond to each sub-pixel is identical with each of total opening lengths corresponding to respective of the other sub-pixels.

6. The vapor deposition device as set forth in claim 1, wherein:
when viewed in the normal direction, in each of the one or more mask opening group areas, mask openings have, in the first direction, opening lengths, which become longer as a distance in the second direction from above the injection hole increases, in a region that is on one straight line extending in the first direction on which line no other mask openings exist.

7. The vapor deposition device as set forth in claim 6, wherein:
when viewed in the normal direction, a total opening length, in the first direction, of one or more mask openings which are arranged in the first direction and correspond to each sub-pixel satisfies the following formulae:

the total opening length in the first direction=reference mask opening length×film thickness correction coefficient, the film thickness correction coefficient=1/(film thickness of vapor-deposited film corresponding to the mask openings arranged in the second direction/smallest film thickness value)

where the "reference mask opening length" is uniform opening lengths in the first direction of the plurality of vapor deposition masks before changing the opening lengths.

8. The vapor deposition device as set forth in claim 6, wherein:
when viewed in the normal direction, a mask opening ratio, in the first direction, of each of one or more mask openings which are arranged in the first direction and correspond to each sub-pixel satisfies the following formulae:

the mask opening ratio in first direction=opening ratio of reference mask opening length×film thickness correction coefficient, film thickness correction coefficient=1/(film thickness of vapor-deposited film corresponding to the mask openings arranged in the second direction/smallest film thickness value)

where the "reference mask opening length" is uniform opening lengths in the first direction of the plurality of vapor deposition masks before changing the opening lengths, and the "opening ratio of reference mask opening length" is 100%.

9. The vapor deposition device as set forth in claim 1, wherein:
the mask openings in each of the plurality of vapor deposition masks have respective lengths which vary in the first direction in accordance with respective locations of the mask openings in the second direction.

10. The vapor deposition device as set forth in claim 1, wherein:
the mask openings provided in each of the plurality of vapor deposition masks have identical shapes; and
the vapor deposition unit has a shielding plate for partially covering mask openings each of which is located on one straight line extending in the first direction, on which one straight line a mask opening of another one of the plurality of vapor deposition masks is provided, so as to change opening lengths in the first direction of the mask openings thus covered, when viewed in the normal direction.

11. The vapor deposition device as set forth in claim 10, wherein:
the shielding plate is provided for each of the one or more mask opening group areas of each of the plurality of vapor deposition masks.

12. The vapor deposition device as set forth in claim 10, wherein:
the shielding plate has an opening area through which each of the one or more mask opening group areas is partially exposed; and
the shielding plate is provided so as to be shared by at least two of the mask opening group areas.

13. A method for forming vapor-deposited films on a film formation target substrate for use in a display device, the vapor-deposited films being formed for respective sub-pixels of the display device in a predetermined pattern, said method comprising the steps of:
moving one of a vapor deposition unit and the film formation target substrate relatively to the other in a first direction; and
using the vapor deposition unit having a vapor deposition source and a plurality of vapor deposition masks,
a length of each of the plurality of vapor deposition masks in the first direction being shorter than a length of a vapor deposition area of the film formation target substrate in the first direction, and a length of each of the plurality of vapor deposition masks in a second direction being shorter than a length of the vapor deposition area in the second direction, the second direction being perpendicular to the first direction,
the plurality of vapor deposition masks including two or more vapor deposition masks arranged at least in the first direction,
each of the plurality of vapor deposition masks having one or more mask opening group areas which are arranged in the second direction via a shielding area corresponding to at least one pixel,
each of the one or more mask opening group areas (i) including a plurality of mask openings which are arranged at least in the second direction and (ii) pairing up with an injection hole of the vapor deposition source, vapor deposition particles being injected from the injection hole,
the two or more vapor deposition masks adjacent to each other in the first direction being out of alignment in the second direction such that, (i) when viewed along the first direction, mask openings in a first end part of each of one or more mask opening group areas of one of the two or more vapor deposition masks overlap, in the second direction, with mask openings in a second end part of each of one or more mask opening group areas of another one of the two or more vapor deposition masks which is adjacent to the one of the two or more vapor deposition masks, the first end part and the second end part being respective two end parts of each of one or more mask opening group areas in the second direction, and (ii) a vapor-deposited film formed via mask openings in the first end part and in the second end part which are adjacent to each other in the first direction extends on one straight line in the first direction,
a total length in the second direction of ones of the plurality of vapor deposition masks being longer than the length of the vapor deposition area in the second direction,
in each of the first end part and the second end part which overlap with each other in the second direction when viewed along the first direction, the mask openings being formed to have, in the first direction, opening lengths which become shorter toward an outer side of the each of one or more mask opening group areas when viewed in a normal direction which is normal to a principal surface of each of the plurality of vapor deposition masks.

14. The vapor deposition method as set forth in claim 13, wherein:
the plurality of vapor deposition masks include (i) two or more vapor deposition masks arranged in the first direction and (ii) another two or more vapor deposition masks arranged in the second direction.

15. The vapor deposition method as set forth in claim 13, wherein:
the two or more vapor deposition masks adjacently arranged in the first direction are arranged such that the first end part of the each of one or more mask opening group areas of each of the two or more vapor deposition masks overlaps with the second end part of another one or more mask opening group areas of another one of the two or more vapor deposition masks in the second direction by one (1) pixel or more.

* * * * *